(12) United States Patent
Marreiro et al.

(10) Patent No.: US 9,041,294 B2
(45) Date of Patent: May 26, 2015

(54) SEMICONDUCTOR COMPONENT AND METHOD

(75) Inventors: David D. Marreiro, Chandler, AZ (US); Sudhama C. Shastri, Phoenix, AZ (US); Stefan Gueorguiev, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 935 days.

(21) Appl. No.: 12/890,718

(22) Filed: Sep. 27, 2010

(65) Prior Publication Data
US 2012/0074846 A1 Mar. 29, 2012

(51) Int. Cl.
*H05B 37/00* (2006.01)
*H02H 9/00* (2006.01)
*H05B 33/08* (2006.01)

(52) U.S. Cl.
CPC .......... *H05B 33/089* (2013.01); *H05B 33/0866* (2013.01); *Y02B 20/341* (2013.01); *H01L 2224/48137* (2013.01); *H01L 2924/13091* (2013.01); *H01L 2924/1305* (2013.01)

(58) Field of Classification Search
USPC .............................. 315/119–122; 257/79–103
See application file for complete search history.

(56) References Cited

U.S. PATENT DOCUMENTS

| | | | |
|---|---|---|---|
| 4,743,897 A | 5/1988 | Perez | |
| 5,914,501 A * | 6/1999 | Antle et al. | 257/99 |
| 6,586,890 B2 | 7/2003 | Min et al. | |
| 6,642,500 B2 | 11/2003 | Takahashi | |
| 7,075,252 B1 | 7/2006 | Blackwood | |
| 7,438,439 B2 | 10/2008 | Nakano | |
| 7,564,666 B2 | 7/2009 | Ball et al. | |
| 7,663,326 B2 | 2/2010 | Santo et al. | |
| 2002/0070914 A1* | 6/2002 | Bruning et al. | 345/102 |
| 2003/0117348 A1 | 6/2003 | Knapp et al. | |
| 2004/0090403 A1 | 5/2004 | Huang | |
| 2005/0243041 A1 | 11/2005 | Vinn | |
| 2006/0038803 A1 | 2/2006 | Miller et al. | |
| 2007/0139928 A1* | 6/2007 | Wang et al. | 362/276 |
| 2009/0050908 A1* | 2/2009 | Yuan et al. | 257/88 |
| 2010/0061025 A1 | 3/2010 | Parker et al. | |
| 2010/0188015 A1* | 7/2010 | Korsunsky et al. | 315/294 |
| 2010/0201283 A1* | 8/2010 | Kawata et al. | 315/287 |
| 2010/0301374 A1* | 12/2010 | Weng | 257/99 |
| 2011/0057569 A1* | 3/2011 | Wei et al. | 315/122 |

OTHER PUBLICATIONS

Michael Day, "LED-driver considerations," Power Management, Analog Applications Journal, pp. 14-18, 1Q 2004.
ON Semiconductor Datasheet for part NIS5135 Series titled "+5 Volt Electronic Fuse," pp. 1-11, Publication Order No. NIS5135/D, Sep. 2010-Rev. 6.
ON Semiconductor Datasheet for part NUD4700 titled "LED Shunt," pp. 1-6, Publication Order No. NUD4700/D, Mar. 2010-Rev. 8.

(Continued)

*Primary Examiner* — Douglas W Owens
*Assistant Examiner* — Jonathan Cooper
(74) *Attorney, Agent, or Firm* — Rennie William Dover

(57) ABSTRACT

A semiconductor component and a method for manufacturing the semiconductor component, wherein the semiconductor component includes one or more transient voltage suppression structures. In an embodiment, the semiconductor component may include an over-voltage detection circuit, an over-current detection circuit, an over-temperature detection circuit, an ESD protection circuit, or combinations of these circuits.

26 Claims, 15 Drawing Sheets

(56) References Cited

OTHER PUBLICATIONS

ON Semiconductor Datasheet for part CM1708-2210NR titled "1-Channel ESD Protector," Publication Order No. CM1708-2210NR/D, pp. 1-6, Apr. 2010-Rev. 1.

ON Semiconductor Datasheet for part NUD4001 titled "High Current LED Driver," pp. 1-8, Publication Order No. NUD4001/D, Jun. 2006-Rev. 6.

Cree Datasheet for part Cree LED Module LMR4 titled "Cree LED Module LMR4 with TrueWhite™ Technology," pp. 1-5, CLD-DS-LMR4 Rev 0, 2010.

Maxim Datasheet for part MAX16814 titled "Integrated, 4-Channel, High-Brightness LED Driver with High-Voltage DC-DC Controller," pp. 1-25, Rev 3, 2010.

ON Semiconductor Datasheet for part NIS5135 titled "+5 Volt Electronic Fuse," pp. 1-11, Publication Order No. NIS5135/D, May 2008-Rev. 0.

California Micro Devices Datasheet for part No. CM1764-xxxxXX titled "1-Channel ESD Protector," Issue X-1, pp. 1-4, Aug. 7, 2009.

Infineon Target Datasheet for part ILD4035 titled "350 mA step down-LED driver IC," pp. 1-11, Mar. 2, 2010, Rev. 3.0.

NXP Product Datasheet for part SSL1750 titled "SMPS control IC for LED drivers," pp. 1-28, Rev. 01, Sep. 15, 2008.

Kevin Tseng, "Protection Zener Series A new application in LED field," Wollemi Technical Incorporation, Jul. 7, 2004.

* cited by examiner

SEMICONDUCTOR COMPONENT AND METHOD

BACKGROUND

The present invention relates, in general, to electronics and, more particularly, to semiconductor components and methods of forming semiconductor components.

High-Brightness Light Emitting Diodes (HB-LEDs) are increasingly being used in general lighting applications, consumer electronics, and automotive applications. Although these types of devices have a high growth potential, they have drawbacks that temper their many advantages. For example, they are vulnerable to damage by Electro-Static Discharge (ESD) events as well as voltage and current transients, e.g., over-voltage and over-current events, that may be present in a power supply terminal. In addition, the use of HB-LEDs in hostile environments such as in outdoor lighting fixtures and in automotive applications may subject these types of devices to high ambient temperatures capable of damaging them.

Accordingly, it would be advantageous to have methods and structures capable of protecting semiconductor components from damage from environmental and electrical stresses. It would be of further advantage for the method and structure to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

For simplicity and clarity of the illustrations, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

Figure 1:
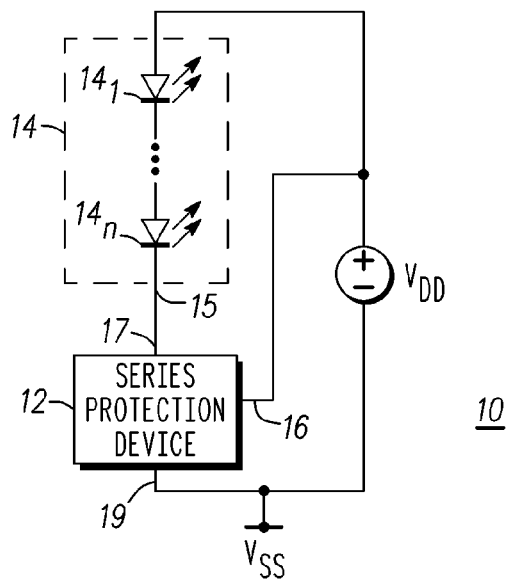
FIG. 1 is a block diagram of a circuit module that includes a protection circuit in accordance with an embodiment of the present invention.

FIG. 1 is a block diagram of a circuit module 10 that includes a protection circuit 12 coupled to a circuit element 14 in accordance with an embodiment of the present invention. Protection circuit 12 is coupled in series between a circuit element 14 and a lower-voltage source of operating potential and therefore may be referred to as a low-side series configured protection circuit. By way of example, circuit element 14 is comprised of a string of series connected Light Emitting Diodes (LEDs) $14_1, \ldots, 14_n$, where "n" is an integer having a value equal to one or greater. Accordingly, the cathode of LED $14_1$ is connected to the anode of LED $14_n$. The cathode 15 of LED $14_n$ is connected to an input 17 of protection circuit 12. It should be noted that in embodiments in which "n" has a value of one, circuit element 14 is comprised of a single LED $14_1$. An output 19 of protection circuit 12 is coupled for receiving a source of operating potential $V_{SS}$. Protection circuit 12 has an input 16 that is coupled for receiving a source of operating potential $V_{DD}$. In operation, the anode of LED $14_1$, like input 16 of protection circuit 12, are coupled for receiving source of operating potential $V_{DD}$. Alternatively, the anode of LED $14_1$ and input 16 can be coupled to a drive circuit that provides a drive signal to LED $14_1$ and an input signal for protection circuit 12. Under normal operating conditions, protection circuit 12 functions as a short circuit such that cathode 15 of LED $14_n$ is connected to operating potential $V_{SS}$. By way of example, operating potential $V_{SS}$ is a ground potential. In response to a stress, the electrical path between input 17 and output 19 is opened, which disconnects input 17, and therefore cathode 15, from output 19. Opening the electrical path protects circuit element 14 from the stressor or stressful condition.

The stressful condition may be an over-voltage condition, an over-current condition, an over-temperature condition, and electrostatic discharge event, combinations thereof, or the like. For example, in embodiments in which the stress is an over-voltage, protection circuit 12 protects against the over-voltages and may be referred to as an over-voltage protection (OVP) circuit. If the voltage at the anode of LED $14_1$, and thus the voltage at input 16, becomes greater than a predetermined reference voltage, protection circuit 12 opens the circuit connection between the cathode of LED $14_n$ and source of operating potential $V_{SS}$. By opening the circuit connection, OVP circuit 12 disconnects circuit element 14 from source of operating potential $V_{SS}$ to substantially stop large currents from flowing through LED string 14. This protects LED string 14 from damage caused by an over-voltage appearing at the anode of LED $14_1$.

Figure 2:
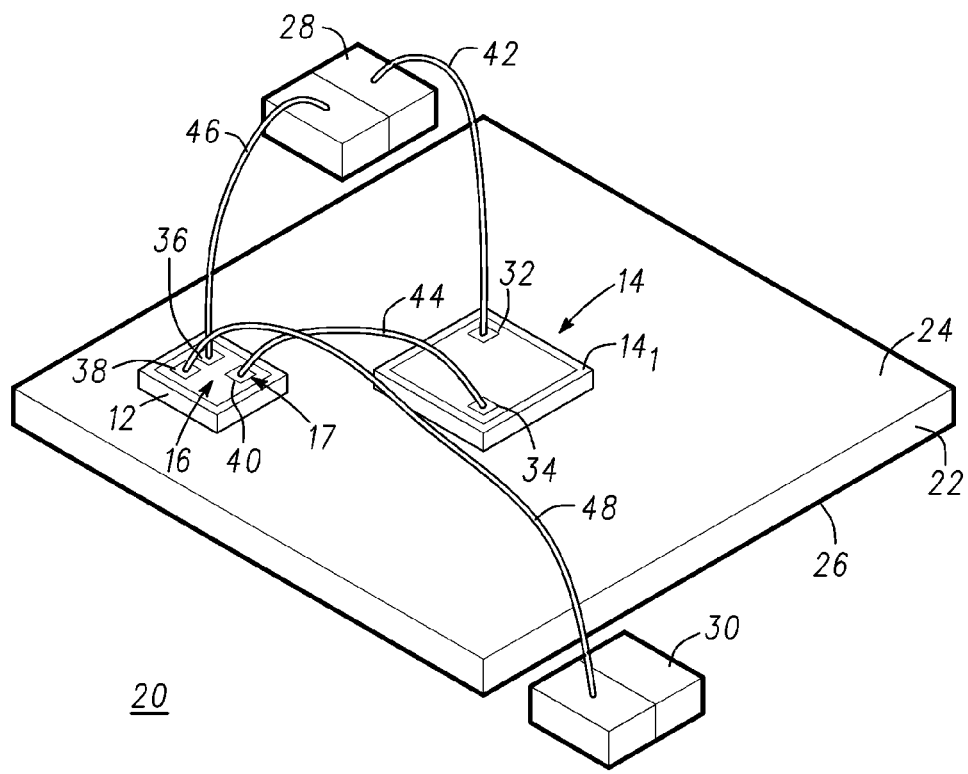
FIG. 2 is an isometric view of a circuit module that includes a protection circuit in accordance with an embodiment of the present invention.

FIG. 2 is an isometric view of a module 20 that includes protection circuit 12 coupled in a low-side series connected configuration to circuit element 14, and where circuit element 14 is comprised of a single LED $14_1$. More particularly, module 20 is comprised of a support 22 having surfaces 24 and 26 and leads 28 and 30. By way of example, support 22 and leads 28 and 30 are square shaped electrically conductive plates where support 22 may be a leadframe flag and leads 28 and 30 may be leadframe leads. Suitable materials for electrically conductive plates include copper, aluminum, metals and metal alloys coated with a precious metal, tin, steel, alloys of copper, beryllium, gold, silver, alloys of aluminum, brass, alloys of brass, or the like. Alternatively, support 22 can be a printed circuit board, a ceramic substrate, a structure comprising a resin, such as epoxy, polyimide, triazine, or a phenolic resin, an epoxy-glass composite, or the like. Although support 22 and leads 28 and 30 have been described as square structures, this is not a limitation of the present invention. Support 22 and leads 28 and 30 may have a triangular shape, a rectangular shape, a pentagon shape, a circular shape, an elliptical shape, or other polygonal shape.

LED 14, and protection circuit 12 are mounted on support 22. LED $14_1$ and protection circuit 12 may be coupled to support 22 using a thermally conductive and electrically conductive die attach material, a thermally conductive and electrically nonconductive die attach material, or the like. LED $14_1$ has bond pads 32 and 34 and protection circuit 12 has bond pads 36, 38, and 40. The anode of LED $14_1$ is connected to bond pad 32 and the cathode of LED $14_1$ is connected to bond pad 34. Lead 28 is connected to bond pad 32 through a wire bond 42 and bond pad 34 is connected to bond pad 40 through a wire bond 44. Input 16 of protection circuit 12 is connected to bond pad 36, which bond pad 36 is connected to lead 28 through a wire bond 46. Input 17 of protection circuit 12 is connected to bond pad 40, which bond pad 40 is connected to bond pad 34 of LED $14_1$ through a wire bond 44. Output 19 of protection circuit 12 is connected to bond pad 38, which bond pad 38 is connected to lead 30 through a wire bond 48. Lead 28 is coupled for receiving a source of operating potential such as, for example, potential $V_{DD}$, and lead 30 is coupled for receiving a source of operating potential such as, for example, $V_{SS}$. In accordance with embodiments of the present invention, operating potential $V_{DD}$ is substantially 3.5 volts and operating potential $V_{SS}$ is substantially 0 volts. Although not shown, support 22, LED 14₁, protection circuit 12, wire bonds 42, 44, 46, and 48, and leads 28 and 30 may be protected by an encapsulant capable of transmitting the light emitted by LED 14₁.

Operating potentials $V_{DD}$ and $V_{SS}$ are selected so that a current flows through LED 14₁ causing it to emit light that is perceptible to the human eye. If the magnitude of the voltage at the anode of LED 14₁ and the magnitude of the voltage at input 16 becomes greater than the magnitude of a reference voltage, protection circuit 12 opens the circuit path so that cathode 15 of LED 14₁ is electrically disconnected from lead 30.

Figure 3:
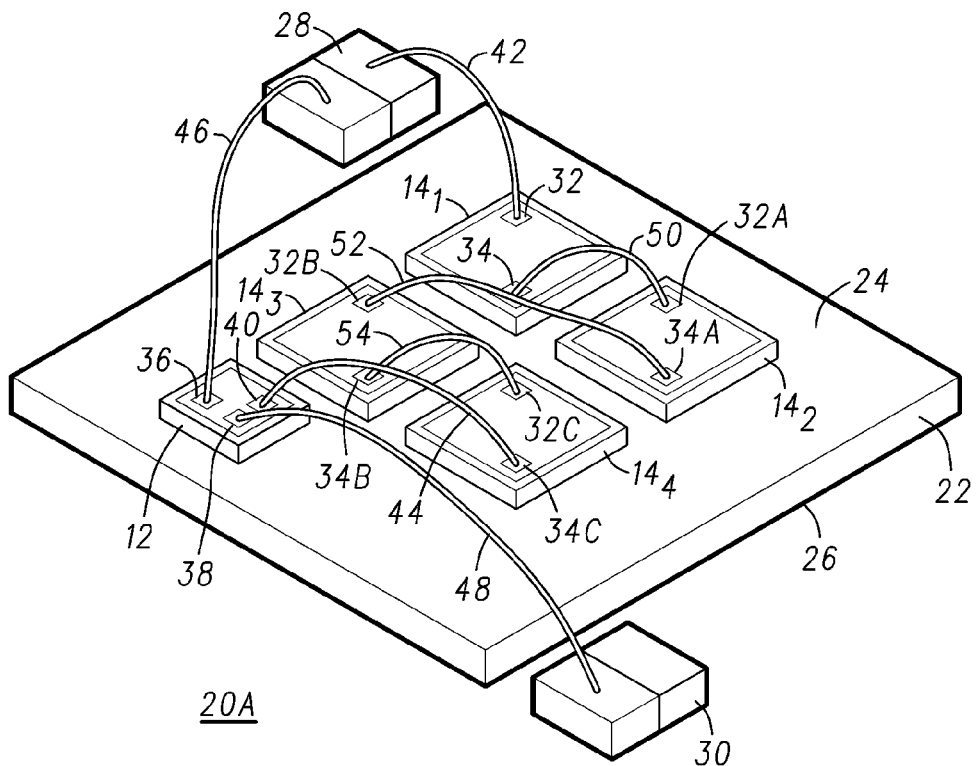
FIG. 3 is an isometric view of a circuit module that includes a protection circuit in accordance with an embodiment of the present invention.

FIG. 3 is an isometric view of a module 20A that includes protection circuit 12 coupled in a low-side series connected configuration to circuit element 14, where circuit element 14 is comprised of LEDs 14₁, 14₂, 14₃, and 14₄, i.e., n is equal to four. Module 20A is similar to module 20 except that it is comprised of a plurality of LEDs. Thus, module 20A is comprised of a support 22 having surfaces 24 and 26 and leads 28 and 30 which have been described with reference to FIG. 2.

LEDs 14₁, 14₂, 14₃, and 14₄ and protection circuit 12 are mounted on Support 22. LEDs 14₁, 14₂, 14₃, and 14₄ and protection circuit 12 may be coupled to support 22 using a thermally conductive and electrically conductive die attach material, a thermally conductive and electrically nonconductive die attach material, or the like. LED 14₁ has bond pads 32 and 34, LED 14₂ has bond pads 32A and 34A, LED 14₃ has bond pads 32B and 34B, LED 14₄ has bond pads 32C and 34C, and protection circuit 12 has bond pads 36, 38, and 40. The anode of LED 14₁ is connected to bond pad 32 and the cathode of LED 14₁ is connected to bond pad 34. Similarly, the anodes of LEDs 14₂, 14₃, and 14₄ are connected to bond pads 32A, 32B, and 32C, respectively, and the cathodes of LEDs 14₂, 14₃, and 14₄ are connected to bond pads 34A, 34B, and 34C, respectively. Lead 28 is connected to bond pad 32 through a wire bond 42, bond pad 34 is connected to bond pad 32A through a wire bond 50, bond pad 34A is connected bond pad 32B through a wire bond 52, bond pad 34B is connected to bond pad 32C through wire bond 54, and bond pad 34C is connected to bond pad 40 through a wire bond 44. Input 16 of protection circuit 12 is connected to bond pad 36, which bond pad 36 is connected to lead 28 through a wire bond 46. Input 17 of protection circuit 12 is connected to bond pad 40, which bond pad 40 is connected to bond pad 34C of LED 14₄ through a wire bond 44. Output 19 of protection circuit 12 is connected to bond pad 38, which bond pad 38 is connected to lead 30 through a wire bond 48. Lead 28 is coupled for receiving a source of operating potential such as, for example, potential $V_{DD}$, and lead 30 is coupled for receiving a source of operating potential such as, for example, $V_{SS}$. In accordance with embodiments of the present invention, operating potential $V_{DD}$ is substantially 14 volts and operating potential $V_{SS}$ is substantially 0 volts. Although not shown, support 22, LEDs 14₁, 14₂, 14₃, and 14₄, protection circuit 12, wire bonds 42, 44, 46, 48, 50, 52, and 54, and leads 28 and 30 may be protected by an encapsulant capable of transmitting the light emitted by LEDs 14₁, 14₂, 14₃, and 14₄.

As discussed above, operating potentials $V_{DD}$ and $V_{SS}$ are selected so that a current flows through LEDs 14₁, 14₂, 14₃, and 14₄ causing them to emit light that is perceptible to the human eye. If the magnitude of the voltage at the anode of LED 14₁ and input 16 becomes greater than the magnitude of a reference voltage, protection circuit 12 opens the circuit path so that the cathode of LED 14₄ is electrically disconnected from lead 30.

Figure 4:
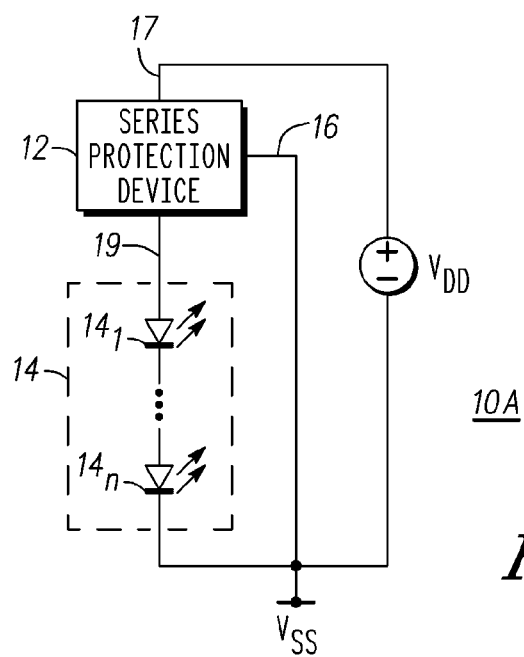
FIG. 4 is a block diagram of a circuit module that includes a protection circuit in accordance with another embodiment of the present invention.

FIG. 4 is a block diagram of a circuit module 10A that includes protection circuit 12 connected in a high-side series configuration and coupled to a circuit element 14 in accordance with another embodiment of the present invention. Protection circuit 12 is referred to as being a high-side series configured because it is coupled in series between circuit element 14 and a higher-voltage source of operating potential. As discussed above, circuit element 14 may be comprised of a string of series connected LEDs 14₁, . . . , 14ₙ, where "n" is an integer having a value of one or greater and protection circuit 12 has inputs 16 and 17 and an output 19. Input 16 is coupled for receiving lower-voltage source of operating potential $V_{SS}$, input 17 is coupled for receiving higher-voltage source of operating potential $V_{DD}$, and output 19 is connected to the anode of LED 14₁. Alternatively, input 17 of protection circuit 12 can be coupled to a drive circuit that provides a drive signal to protection circuit 12. Under normal operating conditions, protection circuit 12 functions as a short circuit such that source of operating potential $V_{DD}$ is connected to the anode of LED 14₁ and input 16 is connected to source of operating potential $V_{SS}$. By way of example, operating potential $V_{SS}$ is a ground potential. In response to a stressor or stress event, the electrical path between input 17 and output 19 is opened, which disconnects input 17 from output 19. Thus circuit element 14 is disconnected from source of operating potential $V_{DD}$. Opening the electrical path protects circuit element 14 from the stressor or stressful condition.

Figure 5:
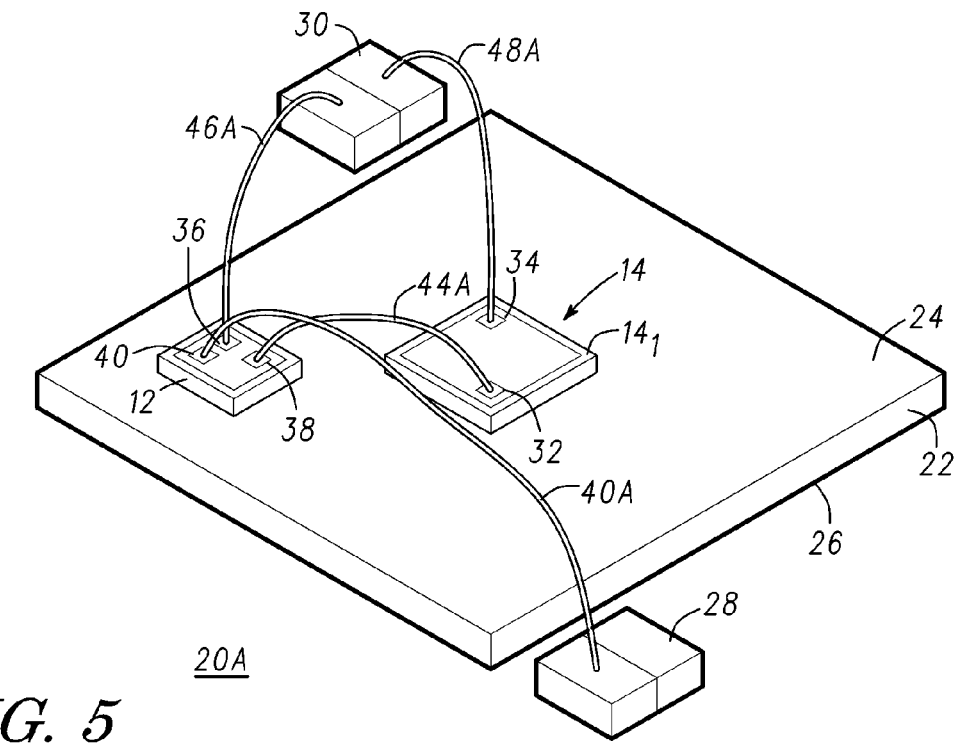
FIG. 5 is an isometric view of a circuit module that includes a protection circuit in accordance with another embodiment of the present invention.

FIG. 5 is an isometric view of a module 20A that includes protection circuit 12 coupled in a high-side series connected configuration to circuit element 14, where circuit element 14 is comprised of a single LED 14₁. More particularly, module 20A is comprised of a support 22 having surfaces 24 and 26 and leads 28 and 30. Support 22 has been described with reference to FIG. 2. LED 14₁ and protection circuit 12 are mounted on support 22. LED 14₁ and protection circuit 12 may be coupled to support 22 using a thermally conductive and electrically conductive die attach material, a thermally conductive and electrically nonconductive die attach material, or the like. LED 14₁ has bond pads 32 and 34 and protection circuit 12 has bond pads 36, 38, and 40. The anode of LED 14₁ is connected to bond pad 38, and thus output 19 of protection circuit 12 through wire bond 44A and the cathode of LED 14₁ is connected to lead 30 through bond pad 34 $_{and}$ wire bond 48A. Lead 28 is connected to bond pad 40 and thus to input 17 of protection circuit 12 through a wire bond 40A. Input 16 of protection circuit 12 is connected to bond pad 36, which bond pad 36 is connected to lead 30 through a wire bond 46A. Lead 28 is coupled for receiving a source of operating potential such as, for example, potential $V_{DD}$, and lead 30 is coupled for receiving a source of operating potential such as, for example, $V_{SS}$. In accordance with embodiments of the present invention, operating potential $V_{DD}$ is substantially 3.5 volts and operating potential $V_{SS}$ is substantially 0 volts. Although not shown, support 22, LED 14₁, protection circuit 12, wire bonds 40A, 44A, 46A, and 48A, and leads 28 and 30 may be protected by an encapsulant capable of transmitting the light emitted by LED 14₁.

Operating potentials $V_{DD}$ and $V_{SS}$ are selected so that a current flows through LED 14₁ causing it to emit light that is perceptible to the human eye. If the magnitude of the voltage at input 17 becomes greater than the magnitude of a reference voltage, protection circuit 12 opens the circuit so that the anode of LED 14₁ is electrically disconnected from lead 28.

Figure 6:
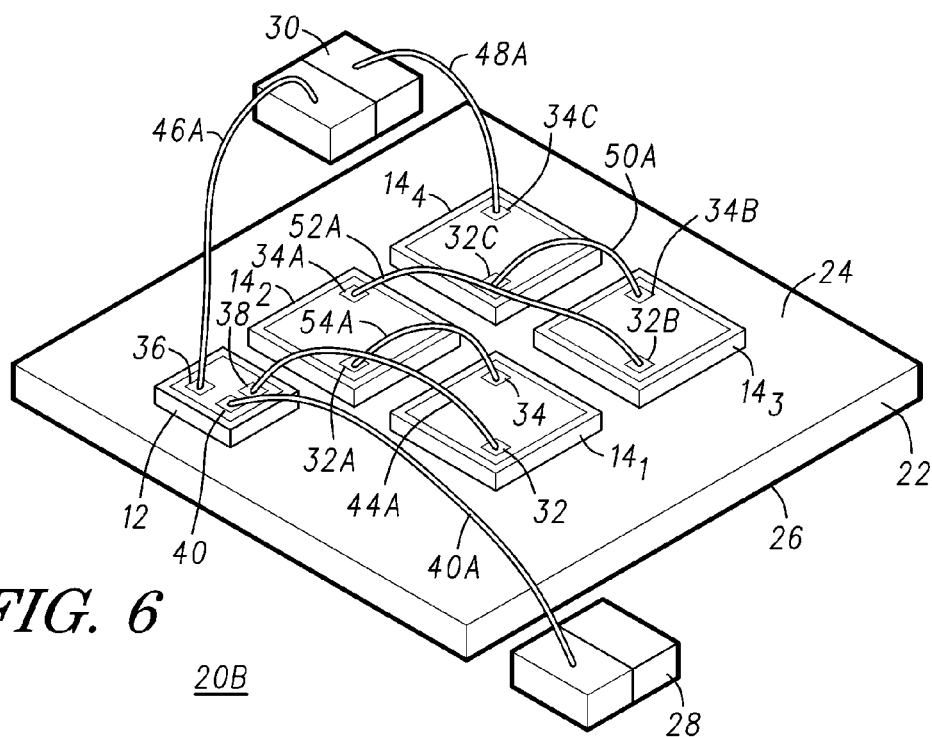
FIG. 6 is an isometric view of a circuit module that includes a protection circuit in accordance with another embodiment of the present invention.

FIG. 6 is an isometric view of a module 20B that includes protection circuit 12 coupled in a high-side series connected configuration to circuit element 14, where circuit element 14 is comprised of LEDs 14₁, 14₂, 14₃, and 14₄, i.e., n is equal to four. Module 20B is similar to module 20A except that it is comprised of a plurality of LEDs. Thus, module 20B is comprised of a support 22 having surfaces 24 and 26 and leads 28 and 30 which have been described with reference to FIG. 2.

LEDs $14_1$, $14_2$, $14_3$, and $14_4$ and protection circuit 12 are mounted on support 22. LEDs $14_1$, $14_2$, $14_3$, and $14_4$ and protection circuit 12 may be coupled to support 22 using a thermally conductive and electrically conductive die attach material, a thermally conductive and electrically nonconductive die attach material, or the like. LED $14_1$ has bond pads 32 and 34, LED $14_2$ has bond pads 32A and 34A, LED $14_3$ has bond pads 32B and 34B, LED $14_4$ has bond pads 32C and 34C, and protection circuit 12 has bond pads 36, 38, and 40.

The anode of LED $14_1$ is connected to bond pad 32, which is connected to bond pad 38, and thus output 19, of protection circuit 12 through wire bond 44A and the cathode of LED $14_4$ is connected to lead 30 through bond pad 34C and wire bond 48A. Lead 28 is connected to bond pad 40, and thus input 17, of protection circuit 12 through a wire bond 40A. Input 16 of protection circuit 12 is connected to bond pad 36, which bond pad 36 is connected to lead 30 through a wire bond 46A, The cathode of LED $14_1$ is connected to bond pad 34 which is connected the anode of LED $14_2$ through a wire bond 54A and bond pad 32A. The cathode of LED 14, is connected to bond pad 34A which is connected to the anode of LED $14_3$ through a wire bond 52A and bond pad 32B. The cathode of LED $14_3$ is connected to bond pad 34B which is connected the anode of LED $14_4$ through a wire bond 50A and bond pad 32C. Lead 28 is coupled for receiving a source of operating potential such as, for example, potential $V_{DD}$, and lead 30 is coupled for receiving a source of operating potential such as, for example, $V_{SS}$. In accordance with embodiments of the present invention, operating potential $V_{DD}$ is substantially 14 volts and operating potential $V_{SS}$ is substantially 0 volts. Although not shown, support 22, LEDs $14_1$, $14_2$, $14_3$, and $14_4$, protection circuit 12, wire bonds 40A, 44A, 46A, 48A, 50A, 52A, 54A, and leads 28 and 30 may be protected by an encapsulant capable of transmitting the light emitted by LEDS $14_1$, $14_2$, $14_3$, and $14_4$.

As discussed above, operating potentials $V_{DD}$ and $V_{SS}$ are selected so that a current flows through LEDs $14_1$, $14_2$, $14_3$, and $14_4$ causing them to emit light that is perceptible to the human eye. If the magnitude of the voltage at input 17 becomes greater than the magnitude of a reference voltage, protection circuit 12 opens the circuit so that the anode of LED $14_4$ is electrically disconnected from lead 28.

Figure 7:
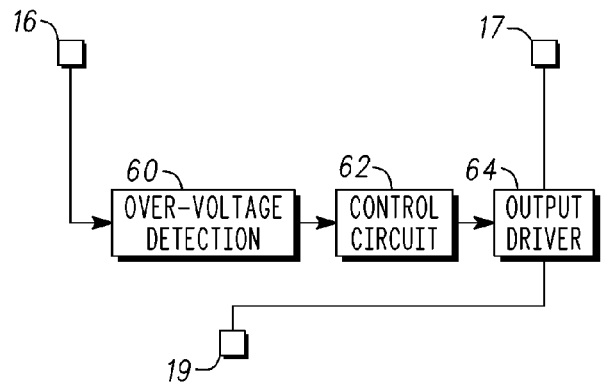
FIG. 7 is a block diagram of protection circuit in accordance with another embodiment of the present invention.

FIG. 7 is a block diagram of protection circuit 12A in accordance with an embodiment of the present invention. It should be understood that the reference character "A" has been appended to reference character "12" to distinguish protection circuit 12A from protection circuit 12 because protection circuit 12A may include different or additional features than protection circuit 12. Protection circuit 12A includes an over-voltage detection circuit or stage 60 and is referred to as an OVP circuit. What is shown in FIG. 7 is protection circuit 12A having inputs 16 and 17 and output 19. Protection circuit 12A includes an over-voltage detection stage 60 having an input connected to input 16 and an output connected to an input of a control circuit 62. Over-voltage detection circuit 60 may be implemented as a resistor voltage divider network coupled between node 16 and node 19 and a comparator having a pair of inputs. The center tap of the resistor voltage divider network may be connected a first input of the comparator and a reference voltage may be connected to the second input of the comparator. An output of control circuit 62 is connected to a control terminal of an output driver 64. Output driver 64 has a terminal connected to input 17 and a terminal connected to output 19. In response to the magnitude of the voltage appearing at input 16 exceeding a reference value, over-voltage detection circuit 60 generates an input signal to control circuit 62 that causes control circuit 62 to generate a control signal. In response to the control signal, output driver 64 opens the path between input 17 and output 19. Opening this path disconnects LED $14_1$ or LEDS $14_1, \ldots, 14_n$ from source of operating potential $V_{SS}$ which reduces the current flowing through LED $14_1$ or LEDS $14_1, \ldots, 14_n$ to zero or substantially zero. Alternatively, protection circuit 12A reduces the current flowing through LED $14_1$ or LEDs $14_1, \ldots, 14_n$ so as to limit, the current to a safe value, where the safe value is a current level substantially equal to the nominal operating current for LED $14_1$ or LEDs $14_1, \ldots, 14_n$. It should be noted that protection circuit 12A may re-establish a connection from input 17 to output 19 in response to a stress being removed, i.e., the voltage decreases back to its nominal value.

Figure 8:
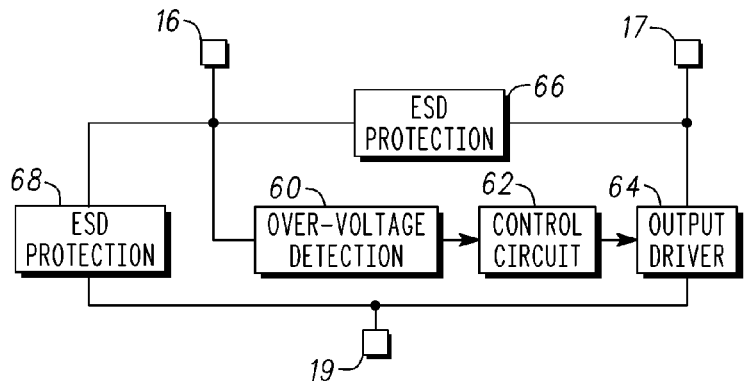
FIG. 8 is a block diagram of protection circuit in accordance with another embodiment of the present invention.

FIG. 8 is a block diagram of a protection circuit 12B in accordance with another embodiment of the present invention. It should be understood that the reference character "B" has been appended to reference character "12" to distinguish protection circuit 12B from protection circuits 12 and 12A because protection circuit 12B may include different or additional features than protection circuits 12 and 12A. More particularly, protection circuit 12B includes an Electrostatic Discharge (ESD) protection circuit 66 coupled between inputs 16 and 17 and an ESD protection circuit 68 coupled between input 16 and output 19. Thus, an ESD event occurring at inputs 16 or 17 activates ESD protection circuit 66 or ESD protection circuit 68 or both. Activation of ESD protection circuit 66 shorts the current path between inputs 16 and 17 and activation of ESD protection circuit 68 shorts the current path between input 16 and output 19.

Figure 9:
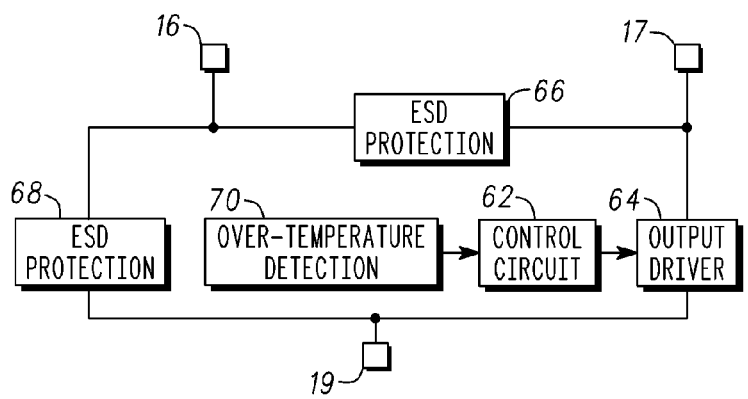
FIG. 9 is a block diagram of protection circuit in accordance with another embodiment of the present invention.

FIG. 9 is a block diagram of a protection circuit 12C in accordance with another embodiment of the present invention. It should be understood that the reference character "C" has been appended to reference character "12" to distinguish protection circuit 12C from protection circuits 12-12B because protection circuit 12C may include different or additional features than protection circuits 12-12B. More particularly, protection circuit 12C includes an over-temperature detection circuit 70 coupled to control circuit 62 rather than over-voltage detection circuit 60, i.e., over-voltage detection circuit 60 is absent from protection circuit 12C. Over-temperature detection circuit 70 may be implemented as a temperature-dependent voltage (such as the voltage across a silicon junction biased with a substantially constant current or the voltage across a temperature-dependent resistor biased with a substantially constant current). Like protection circuit 12B, protection circuit 12C includes an ESD protection circuit 66 coupled between inputs 16 and 17 and an ESD protection circuit 68 coupled between input 16 and output 19, a control circuit 62, and an output driver circuit 64. In response to the magnitude of the ambient temperature being greater than the magnitude of a reference temperature, over-temperature detection circuit generates a control signal that is transmitted to control circuit 62, which generates a control signal that is transmitted to output driver 64. In response to the control signal from control circuit 62, output driver 64, opens the circuit path between input terminal 17 and output terminal 19. in response to an ESD event occurring at inputs 16 or 17, ESD protection circuit 66 or ESD protection circuit 68 or both are activated. Activation of ESD protection circuit 66 shorts the current path between inputs 16 and 17 and activation, of ESD protection circuit 68 shorts the current path between input 16 and output 19.

Figure 10:
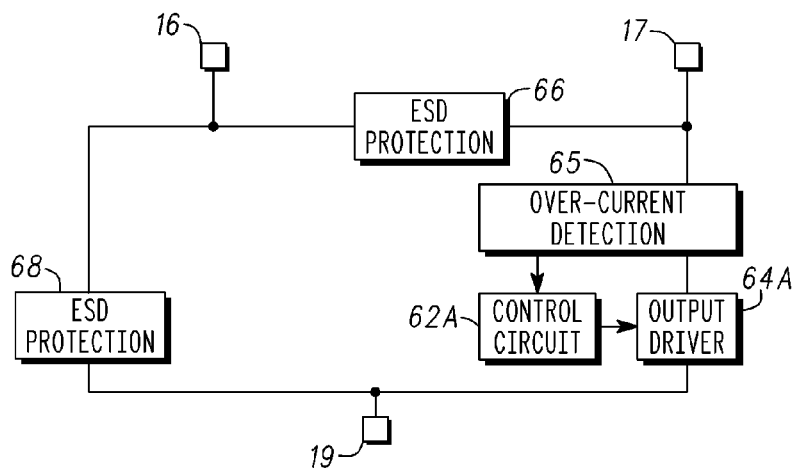
FIG. 10 is a block diagram of protection circuit in accordance with another embodiment of the present invention.

FIG. 10 is a block diagram of a protection circuit 12D in accordance with another embodiment of the present invention. It should be understood that the reference character "D" has been appended to reference character "12" to distinguish protection. circuit 12D from protection circuits 12-12C because protection circuit 12D may include different or additional features than protection circuits 12-12C. Protection circuit 12D includes an over-current detection stage or circuit 65 having an input connected to input 17, an output connected to input of control circuit 62A, and another output connected to an input of output driver circuit 64A. Over-current detection circuit may be implemented as a sense resistor coupled to an amplifier, or a sense resistor coupled to a first input of a comparator circuit, and a second input of said comparator connected to a reference voltage source. Alternatively, the current sensor can be implemented as a voltage across a sense MOSFET, which shares a gate or a source (for high-side or low-side configurations, respectively) with the main MOSFET in the driver circuit. An output of control circuit 62A is connected to another input of output driver 64A. An optional ESD protection circuit 66 may be coupled between inputs 16 and 17 and an optional ESD protection circuit 68 may be coupled between input 16 and output 19. In response to an ESD event occurring at inputs 16 or 17, ESD protection circuit 66 or ESD protection circuit 68 or both are activated. In response to an over-current stress condition, over-current detection circuit 65 generates a control signal that is transmitted to the input of control circuit 62A, which generates a control signal that causes output driver 64A to open the electrical path between input 17 and output 19. Opening this path disconnects LED $14_1$ or LEDs $14_1, \ldots, 14_n$ from source of operating potential $V_{SS}$ which reduces the current flowing through LED $14_1$ or LEDs $14_1, \ldots, 14_n$ to zero or substantially zero. Alternatively, protection circuit 12D reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 11:
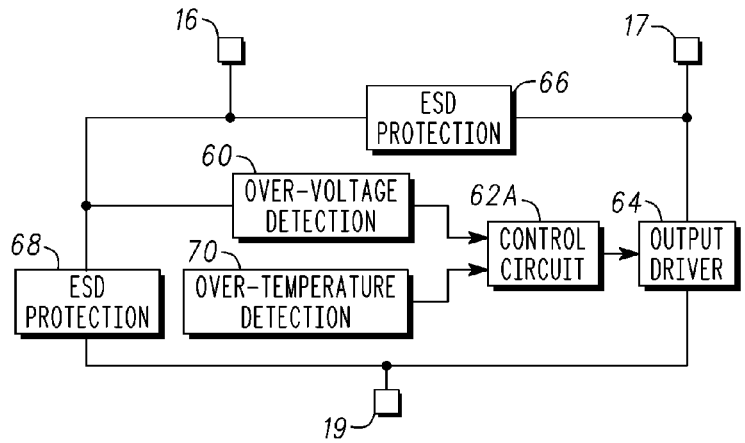
FIG. 11 is a block diagram of protection circuit in accordance with another embodiment of the present invention.

FIG. 11 is a block diagram of a protection circuit 12E in accordance with another embodiment of the present invention. It should be understood that the reference character "E" has been appended to reference character "12" to distinguish protection circuit 12E from protection circuits 12-12D because protection circuit 12E may include different or additional features than protection circuits 12-12a Protection circuit 12E includes an over-voltage detection stage or circuit 60 and an over-temperature detection stage or circuit 70. Over-voltage detection stage 60 and over-temperature detection stage 70 each have an output connected to corresponding inputs of control circuit 62A, which has an output connected to an input of output driver 64. Like protection circuits 12B-12D, protection circuit 12E includes optional ESD protection circuit 66 coupled between inputs 16 and 17 and an optional ESD protection circuit 68 coupled between input 16 and output 19. It should be noted that protection circuit 12E may re-establish a connection from input 17 to output 19 in response to a stress being removed, i.e., the voltage decreases back to its nominal value.

In operation, an over-voltage condition at input 16, an over-temperature condition, or both generate control signals at corresponding outputs, The control signals are used by control circuit 62A to generate a control signal to which output driver 64A responds by opening the electrical path between input 17 and output 19. Opening this path disconnects LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12E reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 12:
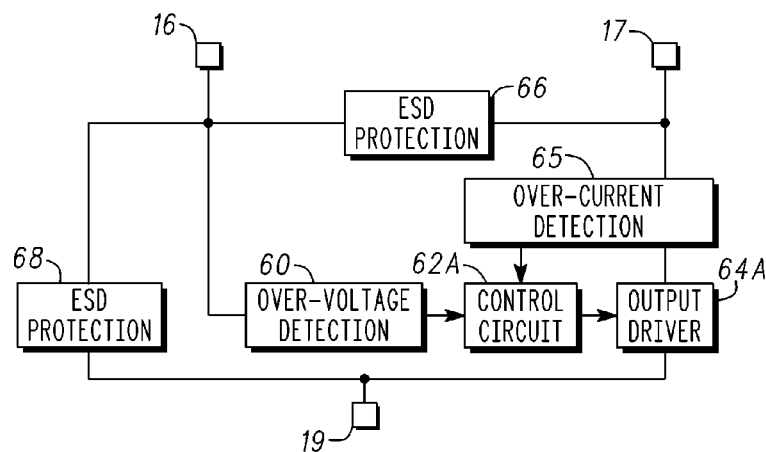
FIG. 12 is a block diagram of protection circuit in accordance with another embodiment of the present invention.

FIG. 12 is a block diagram of a protection circuit 12F in accordance with another embodiment of the present invention. It should be understood that the reference character "F" has been appended to reference character "12" to distinguish protection circuit 12F from protection circuits 12-12E because protection circuit 12F may include different or additional features than protection circuits 12-12E. Protection circuit 12F includes an over-voltage detection circuit 60 having an input connected to input 16 and an output connected to an input of a control circuit 62A. Control circuit 62A has an output connected to an input of an output driver circuit 64A. In addition, protection circuit 12F includes an over-current detection stage or circuit having an input connected to input 17, an output connected to another input of control circuit 62A and another output connected to another input of output driver circuit 64A. An optional ESD protection circuit 66 may be coupled between inputs 16 and 17 and an optional ESD protection circuit 68 may be coupled between input 16 and output 17. In response to a stress condition, one or both of over-voltage detection circuit and over-current detection circuit 65 generate a control signal for control circuit 62A. Over-voltage detection circuit 60 generates an input signal to control circuit 62A in response to the magnitude of the voltage appearing at input 16 exceeding a reference value, and over-current detection circuit 65 generates an input signal to control circuit 62A in response to the magnitude of the current flowing from input 17 exceeding the magnitude of a reference current level. In response to one or both of the control signals from over-voltage detection circuit 60 or over-current detection circuit 65, control circuit 62A generates a control signal that causes output driver 64A to open the electrical path between input 17 and output 19. Opening this path disconnects LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12F reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 13:
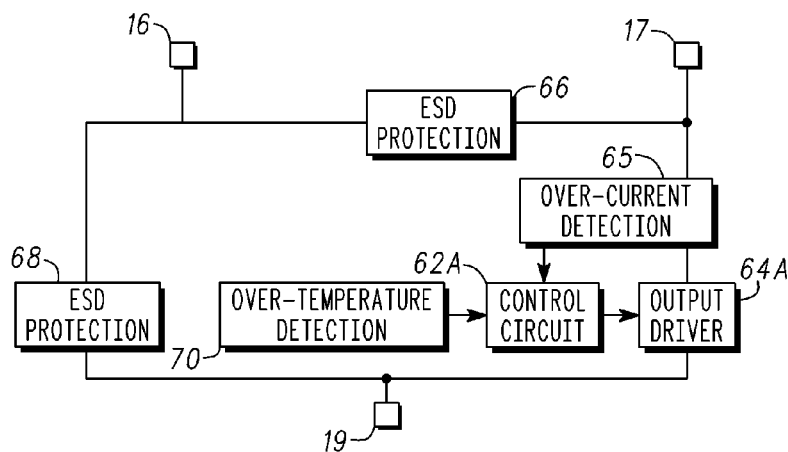
FIG. 13 is a block diagram of protection circuit in accordance with another embodiment of the present invention.

FIG. 13 is a block diagram of a protection circuit 12G in accordance with an embodiment of the present invention. It should be understood that the reference character "G" has been appended to reference character "12" to distinguish protection circuit 12G from protection circuits 12-12F because protection circuit 12G may include different or additional features than protection circuits 12-12F. Protection circuit 12G includes an over-current detection stage or circuit 65 having an input connected to input 17, an output connected to another input of control circuit 62A and another output connected to an input of output driver circuit 64A and an over-temperature detection circuit 70 having an output connected to another input of control circuit 62A. An optional ESD protection circuit 66 may be coupled between inputs 16 and 17 and an optional ESD protection circuit 68 may be coupled between. input 16 and output 17. In response to a stress condition, one or both of over-current detection circuit 65 or over-temperature detection circuit 70 generates a control signal for control circuit 62A, Over-current detection circuit 65 generates an input signal to control circuit 62A in response to the magnitude of the current flowing from input 17 exceeding the magnitude of a reference current level and over-temperature detection circuit 70 generates an input signal to control circuit 62A in response to the magnitude of the temperature exceeding the magnitude of a reference temperature. In response to at least one of the control signals from over-current detection circuit 65 or over-temperature detection circuit 70, control circuit 62A generates a control signal that causes output driver 64A to open the path between input 17 and output 19. Opening this path disconnects LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12G reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 14:
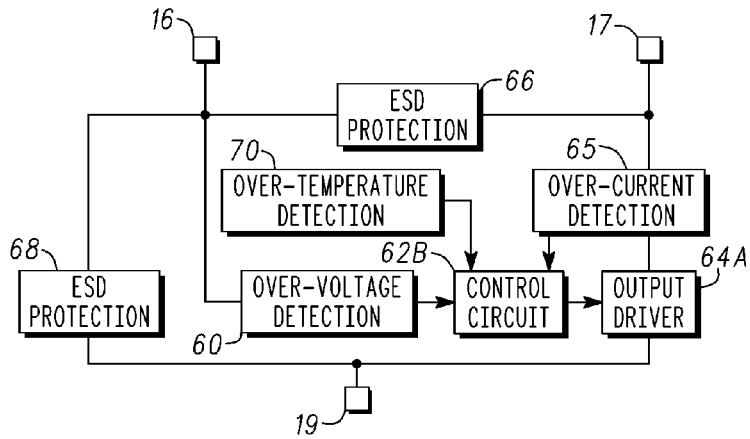
FIG. 14 is a block diagram of a protection circuit in accordance with another embodiment of the present invention.

FIG. 14 is a block diagram of a protection circuit 12H in accordance with another embodiment of the present invention. It should be understood that the reference character "H" has been appended to reference character "12" to distinguish protection circuit 12H from protection circuits 12-12G because protection circuit 12H may include different or additional features than protection circuits 12-12G. Protection circuit 12H includes an over-voltage detection circuit 60 having an input connected to input 16 and an output connected to an input of a control circuit 62B. Control circuit 62B has an output connected to an input of an output driver circuit 64A. In addition, protection circuit 12H includes an over-current detection stage or circuit 65 having an input connected to input 17, an output connected to another input of control circuit 62B and another output connected to another input of output driver circuit 64A and an over-temperature detection circuit 70 having an output connected to another input of control circuit 62B. An optional ESD protection circuit 66 may be coupled between inputs 16 and 17 and an optional ESD protection circuit 68 may be coupled between input 16 and output 17. In response to a stress condition, one or more of over-voltage detection circuit 60, over-current detection circuit 65, or over-temperature detection circuit 70 generates a control signal for control circuit 62B. Over-voltage detection circuit 60 generates an input signal to control circuit 62B in response to the magnitude of the voltage appearing at input 16 exceeding a reference value, over-current detection circuit 65 generates an input signal to control circuit 62B in response to the magnitude of the current flowing from input 17 exceeding the magnitude of a reference current level, and over-temperature detection circuit 70 generates an input signal to control circuit 62B in response to the magnitude of the temperature exceeding the magnitude of a reference temperature. In response to at least one of the control signals from over-voltage detection circuit 60, over-current detection circuit 65, or over-temperature detection circuit 70, control circuit 62A generates a control signal that causes output driver MA to open the path between input 17 and output 19. Opening this path disconnects LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12H reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 15:
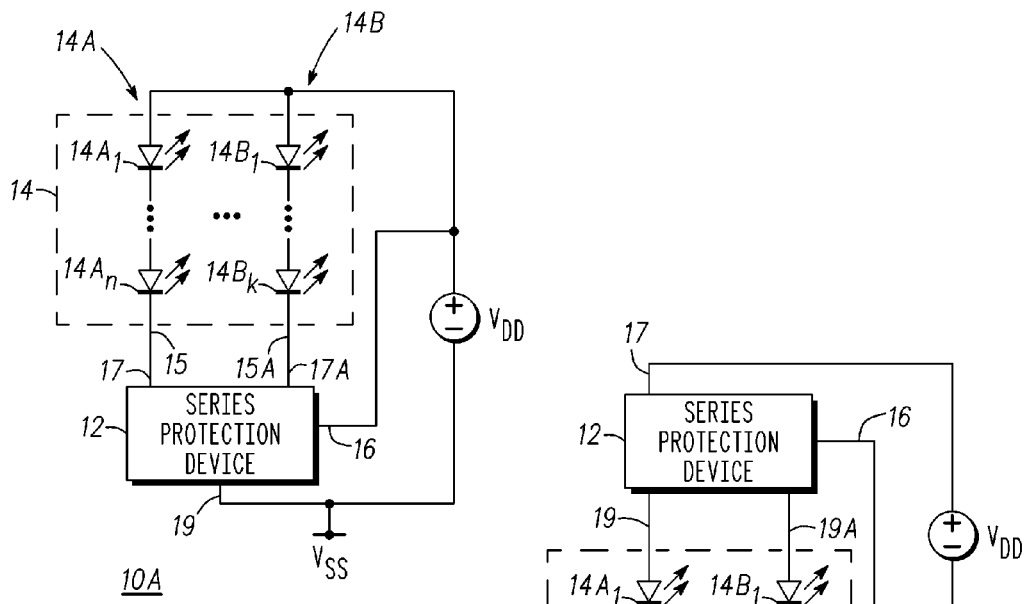
FIG. 15 is a block diagram of a circuit module that includes a protection circuit in accordance with another embodiment of the present invention.

FIG. 15 is a block diagram of a circuit module 10A that includes a protection circuit 12 coupled to circuit elements 14A and 14B in accordance with an embodiment of the present invention. Protection circuit 12 is coupled in series between a circuit element 14A and a lower-voltage source of operating potential and between a circuit element 14B and the lower voltage source of operating potential. Because of the locations of the connections of circuit elements 14A and 14B, circuit module 10A may be referred to as a low-side series configured protection circuit. By way of example, circuit element 14A is comprised of a string of series connected LEDs $14A_1, \ldots, 14A_n$, where "n" is an integer having a value equal to one or greater and a string of series connected LEDs $14B_1, \ldots, 14B_k$, where "k" is an integer having a value equal to one or greater. It should be noted that integers "n" and "k" may have the same value or they may have different values. When integers "n" and "k" have the same values, the strings of series connected LEDs have the same number of LEDs. When integers "n" and "k" have different values, the string of series connected LEDs $14A_1, \ldots, 14A_n$ has a different number of LEDs than the string of series connected LEDs $14B_1, \ldots, 14B_k$. The cathode of LED $14A_1$ is connected to the anode of LED $14A_n$ and the cathode of LED $14B_1$ is connected to the anode of LED $14B_n$. The cathode 15 of LED $14A_n$ is connected to an input 17 of protection circuit 12 and the cathode 15A of LED $14B_n$ is connected to an input 17A of protection circuit 12. It should be noted that in embodiments in which "n" has a value of one, circuit element 14A is comprised of a single LED $14A_1$ and in embodiments in which "k" has a value of one, circuit element 14B is comprised of a single LED $14B_1$. An output 19 of protection circuit 12 is coupled for receiving a source of operating potential $V_{SS}$. Protection circuit 12 has an input 16 that is connected to the anodes of LEDs $14A_1$ and $14B_1$. In operation, the anodes of LEDs $14A_1$ and $14B_1$ and input 16 of protection circuit 12 are coupled for receiving a source of operating potential $V_{DD}$. Alternatively, the anode of LEDs $14A_1$ and $14B_1$ and input 16 can be coupled to a drive circuit that provides a drive signal to LEDs $14A_1$ and $14B_1$ and an input signal for protection circuit 12. Under normal operating conditions, protection circuit 12 functions as a short circuit such that cathode 15 of LEDs $14A_n$ and $14B_k$ are connected to operating potential $V_{SS}$. By way of example, operating potential $V_{SS}$ is a ground potential. In response to a stress, the electrical path between input 17 and output 19 is opened, which disconnects inputs 17 and 17A, and therefore cathodes 15 and 15A, from output 19. Opening the electrical path protects circuit elements 14A and 14B from the stressor or stressful condition.

The stressful condition may be an over-voltage condition, an over-current condition, an over-temperature condition, combinations thereof, or the like, For example, in embodiments in which the stress is an over-voltage, protection circuit 12 protects against the over-voltages and may be referred to as an over-voltage protection (OVP) circuit. If the voltage at the anodes of LEDs $14A_1$ and $14B_1$, and thus the voltage at input 16, becomes greater than a predetermined reference voltage, protection circuit 12 opens the circuit connection between the cathodes of LEDs $14A_n$ and $14B_k$ and source of operating potential $V_{SS}$. By opening the circuit connection, OVP circuit 12 disconnects circuit elements 14A and 14B from source of operating potential $V_{SS}$ to substantially stop large currents from flowing through LED strings 14A and 14B. This protects LED strings 14A and 14B from damage caused by an over-voltage appearing at the anodes of LED $14A_1$ and $14B_1$.

Figure 16:
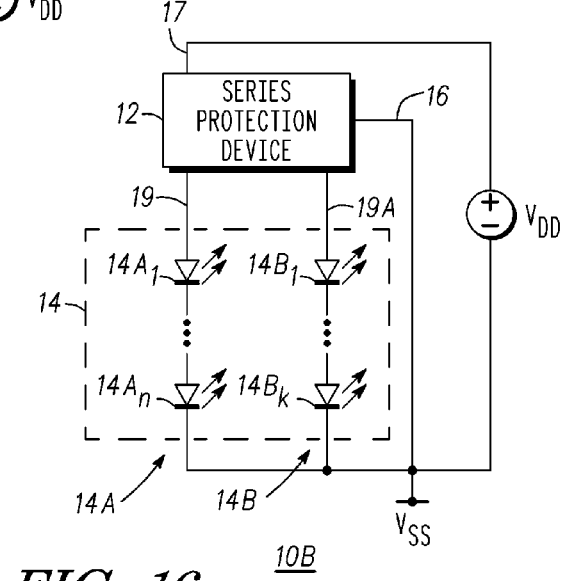
FIG. 16 is a block diagram of a circuit module that includes a protection circuit in accordance with another embodiment of the present invention.

FIG. 16 is a block diagram of a circuit module 10B that includes Protection circuit 12 connected in a high-side series configuration and coupled to circuit elements 14A and 14B in accordance with another embodiment of the present invention. Protection circuit 12 is referred to as being a high-side series configured because it is coupled in series between circuit elements 14A and 14B and a higher-voltage source of operating potential. As discussed above, circuit element 14A may be comprised of a string of series connected LEDs $14A_1, \ldots, 14A_n$, where "n" is an integer having a value of one or greater and circuit element 14B may be comprised of a string of series connected LEDs $14B_1, \ldots, 14B_k$, where "k" is an integer having a value of one or greater. It should be noted that integers "n" and "k" may have the same value or they may have different values. When integers "n" and "k" have the same values, the strings of series connected LEDs have the same number of LEDs. When integers "n" and "k" have different values, the string of series connected LEDs $14A_1, \ldots, 14A_n$ has a different number of LEDs than the string of series connected LEDs $14B_1, \ldots, 14B_k$. Protection circuit 12 has inputs 16 and 17 and an outputs 19A and 19B. Input 16 is coupled for receiving lower-voltage source of operating potential $V_{SS}$, input 17 is coupled for receiving higher-voltage source of operating potential $V_{DD}$, and outputs 19A and 19B are connected to the anodes of LEDs $14A_1$ and $14B_1$ respectively. Alternatively, input 17 of protection circuit 12 can be coupled to a drive circuit that provides a drive signal to protection circuit 12. Under normal operating conditions, protection circuit 12 functions as a short circuit such that source of operating potential $V_{DD}$ is connected to the anodes of LEDs $14A_1$ and $14B_1$ and input 16 is connected to source of operating potential $V_{SS}$. By way of example, operating potential $V_{SS}$ is a ground potential. In response to a stress, the electrical path between input 17 and output 19A and 19B are opened, which disconnects input 17 from output 19A and 19B. Thus circuit elements 14A and 14B are disconnected from source of operating potential $V_{DD}$. Opening the electrical path protects circuit elements 14A and 14B from the stressor or stressful condition. As discussed above, the stressful condition may be an over-voltage condition, an over-current condition, an over-temperature condition, combinations thereof, or the like.

Figure 17:
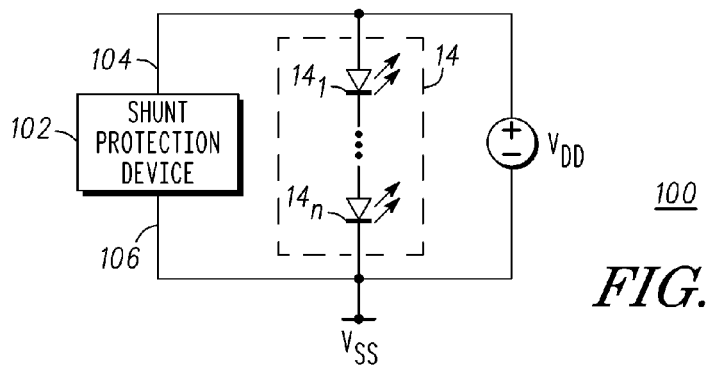
FIG. 17 is a block diagram of a circuit module that includes a protection circuit in accordance with another embodiment of the present invention.

FIG. 17 is a block diagram of a circuit module 100 that includes a protection circuit 102 coupled in a shunt configuration to a circuit element 14 in accordance with an embodiment of the present invention. By way of example, circuit element 14 is comprised of a string of series connected LEDs $14_1, \ldots, 14_n$, where "n" is an integer having a value of one or greater. When "n" has a value of one, circuit element 14 is comprised of a single LED $14_1$. In operation, an anode of LED $14_1$ is coupled for receiving a source of operating potential $V_{DD}$. Alternatively, the anode of LED $14_1$ can be coupled to a drive circuit that provides a drive signal to LED $14_1$. The cathode of LED $14_n$ is coupled for receiving a source of operating potential $V_{SS}$. By way of example, operating potential $V_{SS}$ is a ground potential. Shunt configured protection device 102 includes an input 104 connected to the anode of LED $14_1$ and an output 106 connected to the cathode of LED $14_n$. Under normal operating conditions, shunt protection device 102 functions as an open circuit such that current flows through LEDs $14_1$-$14_n$, but does not flow through shunt protection device 102.

In accordance with an embodiment in which shunt protection circuit 102 protects against over voltages, shunt configured protection circuit 102 is referred to as an over-voltage protection (OVP) circuit. OVP circuit 102 includes an input 104 and an output 106. Input 104 is connected to the anode of LED $14_1$ for monitoring the voltage at the anode of LED $14_1$. If the voltage at the anode of LED $14_1$, and thus the voltage at input 104, becomes greater than a predetermined reference voltage, OVP circuit 102 closes the circuit connection between the source of operating potential $V_{DD}$ and the source of operating potential $V_{SS}$. By closing the circuit connection, OVP circuit 102 shunts diode string 14 from source of operating potential $V_{DD}$ to substantially stop large currents from flowing through LED string 14. This protects LED string 14 from damage caused by an overvoltage appearing at the anode of LED $14_1$.

Figure 18:
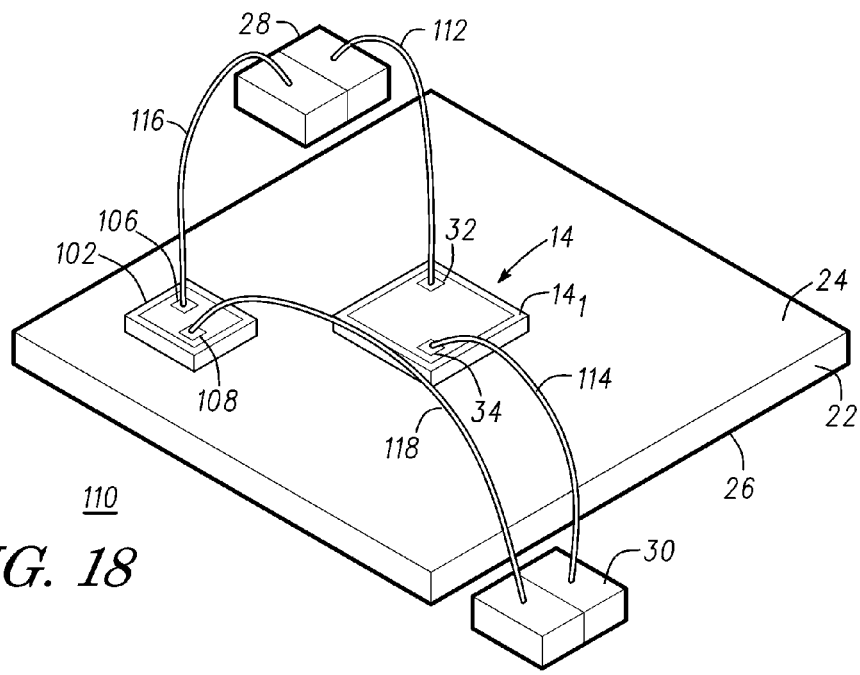
FIG. 18 is an isometric view of a circuit module that includes a protection circuit in accordance with another embodiment of the present invention.

FIG. 18 illustrates an isometric view of a module 110 that includes shunt configured protection circuit 102 coupled to circuit element 14, where circuit element 14 is comprised of a single LED $14_1$. More particularly, module 110 is comprised of a support 22 having surfaces 24 and 26 and leads 28 and 30, which have been described with reference to FIG. 2.

LED $14_1$ and a protection circuit 102 are mounted on support 22. LED $14_1$ and protection circuit 102 may be coupled to support 22 using a thermally conductive and electrically conductive die attach material, a thermally conductive and electrically nonconductive die attach material, or the like. LED $14_1$ has bond pads 32 and 34 and protection circuit 102 has bond pads 106 and 108. The anode of LED $14_1$ is connected to bond pad 32 and the cathode of LED $14_4$ is connected to bond pad 34. Lead 28 is connected to bond pad 32 through a wire bond 112 and bond pad 34 is connected lead 30 through a wire bond 114. Bond pad 106 of protection circuit 102 is connected to lead 28 via a bond wire 116. Bond pad 108 is connected to lead 30 through a wire bond 118. Lead 28 is coupled for receiving a source of operating potential such as, for example, potential $V_{DD}$, and lead 30 is coupled for receiving a source of operating potential such as, for example, $V_{SS}$. In accordance with embodiments, operating potential $V_{DD}$ is substantially 3.5 volts and operating potential $V_{SS}$ is substantially 0 volts. Although not shown, support 22, LED $14_1$, protection circuit 102, wire bonds 112, 114, 116, and 118, and leads 28 and 30 may be protected by an encapsulant capable of transmitting the light emitted by LED $14_1$.

Figure 19:
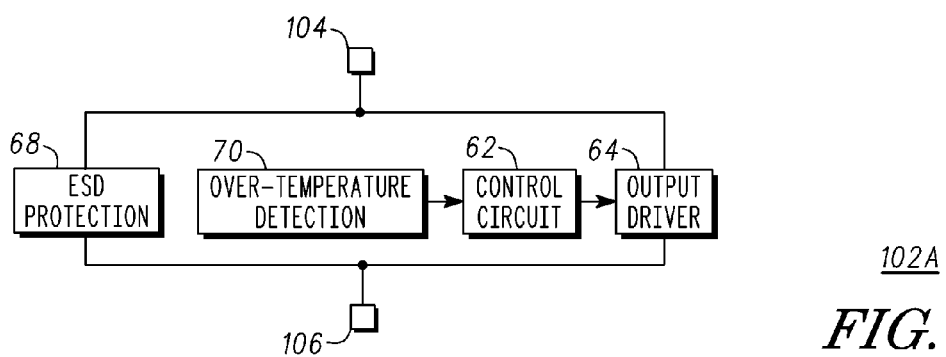
FIG. 19 is a block diagram of protection circuit in accordance with another embodiment of the present invention.

FIG. 19 is a block diagram of protection circuit 102A in accordance with an embodiment of the present invention. It should be understood that the reference character "A" has been appended to reference character "102" to distinguish protection circuit 102A from protection circuit 102 because protection circuit 102A may include different or additional features than protection circuit 102. Protection circuit 102A provides over-temperature protection and is referred to as an OTP circuit. What is shown in FIG. 19 is protection circuit 102A having an input 104 and an output 106. An optional ESD protection circuit 68 may be coupled between input 104 and output 106.

Protection circuit 102A includes an over-temperature detection stage 70 having an output connected to an input of a control circuit 62. An output of control circuit 62 is connected to a. control terminal of an output driver 64. Output driver 64 has a terminal connected to input 104 and a terminal connected to output 106. in response to the magnitude of the temperature exceeding a reference value, over-temperature detection circuit 70 generates an input signal to control circuit 62 that causes control circuit 62 to generate a control signal which in turn causes output driver 64 to close the path between input 104 and output 106. Closing this path shunts current from LED $14_1$ or LEDs $14_1, \ldots, 14_n$ from source of operating potential $V_{SS}$, which results in reducing the current flowing through LED $14_1$ or LEDs $14_1, \ldots, 14_n$ to be substantially zero or to be zero. Alternatively, protection circuit 102A reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 20:
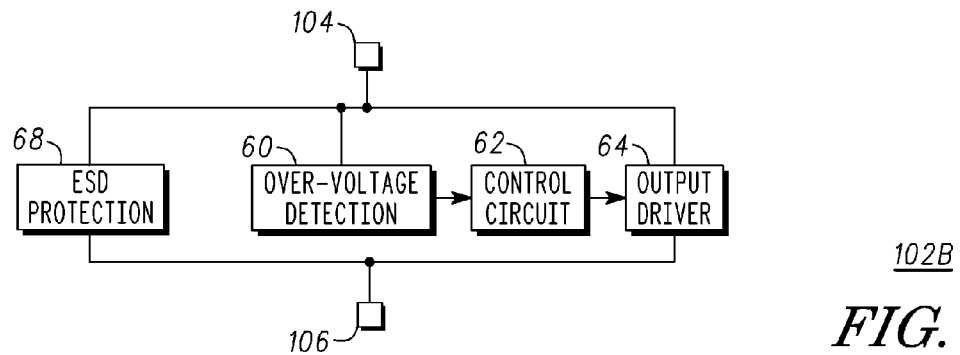
FIG. 20 is a block diagram of protection circuit in accordance with another embodiment of the present invention.

FIG. 20 is a block diagram of protection circuit 102B in accordance with an embodiment of the present invention. It should be understood that the reference character "B" has been appended to reference character "102" to distinguish protection circuit 102B from protection circuit 102A because protection circuit 102B may include different or additional features than protection circuits 102 and 102A. Protection circuit 102B provides over-voltage detection circuit and is referred to as an OVP circuit. What is shown in FIG. 20 is protection circuit 102B having an input 104 and an output 106. Protection circuit 102B includes an over-voltage detection stage 60 having an input connected to input 104 and an output connected to an input of a control circuit 62. Over-voltage detection circuit 60 may be implemented as a resistor voltage divider network coupled between the node 104 and the node 106 and a comparator having a pair of inputs. The center tap of the resistor voltage divider network may be connected a first input of the comparator and a reference voltage may be connected to the second input of the comparator. Optionally, and ESD protection circuit 68 may be coupled between terminals 104 and 106. An output of control circuit 62 is connected to a control terminal of an output driver 64. Output driver 64 has a terminal connected to input 104 and a terminal connected to output 106. In response to the magnitude of the voltage appearing at input 104 exceeding the magnitude of a reference value, over-voltage detection circuit 60 generates an input signal to control circuit 62 which responds by generating a control signal for output driver 64. In response to the control signal, output driver 64 closes the path between input 104 and output 106. Closing this path shunts current from LED $14_1$ or LEDs $14_1, \ldots, 14_n$ from source of operating potential $V_{SS}$ which results in reducing the current flowing through LED $14_1$ or LEDs $14_1, \ldots, 14_n$ to be substantially zero or to be zero. Alternatively, protection circuit 102A reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

Figure 21:
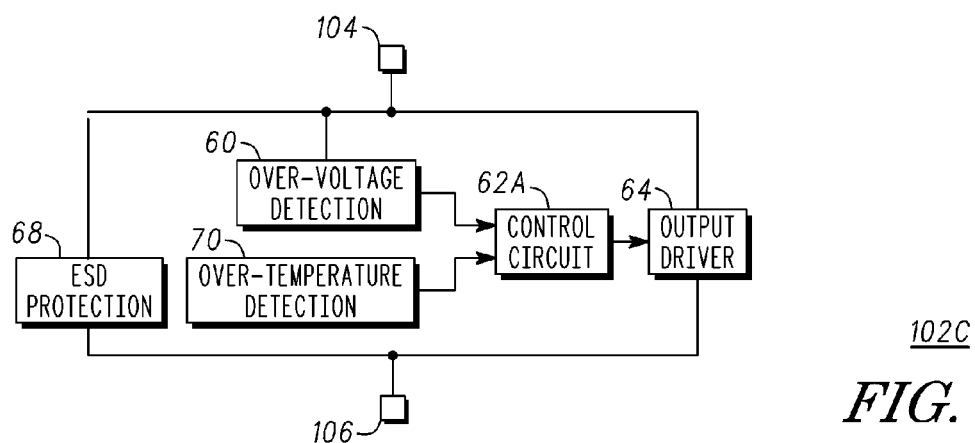
FIG. 21 is a block diagram of protection circuit in accordance with another embodiment of the present invention.

FIG. 21 is a block diagram of a protection circuit 102C in accordance with another embodiment of the present invention. It should be understood that the reference character "C" has been appended to reference character "102" to distinguish protection circuit 102C from protection circuits 102-102B because protection circuit 102C may include different or additional features than protection circuits 102-102B. In addition to over-voltage detection stage or circuit 60, protection circuit 102C includes an over-temperature detection circuit 70 having an output connected to another input of control circuit 62A and an output connected to an output driver 64. Like protection circuit 102B, protection circuit 102C may include an optional ESD protection circuit 68 coupled between input 104 and output 106.

Figure 22:
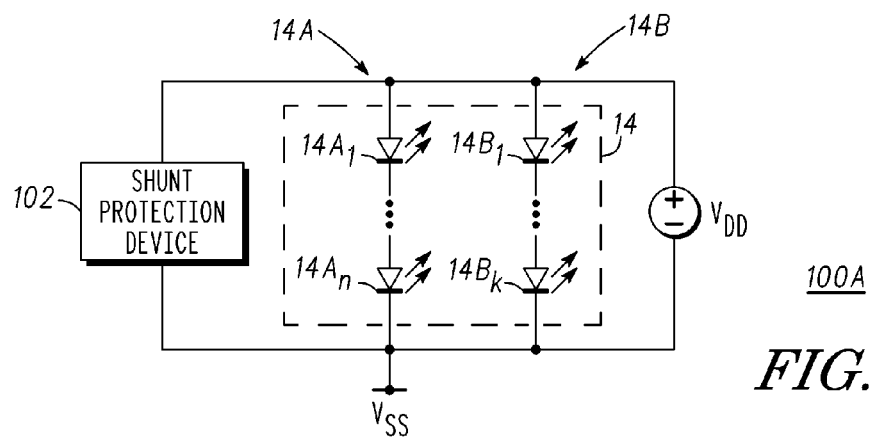
FIG. 22 is a block diagram of a circuit module that includes a protection circuit in accordance with another embodiment of the present invention.

FIG. 22 is a block diagram of a circuit module 100A that includes a Protection circuit 102 coupled in a shunt configuration to a circuit element 14 in accordance with an embodiment of the present invention. By way of example, circuit element 14A is comprised, of a string of series connected LEDs $14A_1, \ldots, 14A_n$, where "n" is an integer having a value equal to one or greater and a string of series connected LEDs $14B_1, \ldots, 14B_k$, where "k" is an integer having a value equal to one or greater. It should be noted that integers "n" and "k" may have the same value or they may have different values. When integers "n" and "k" have the same values, the strings of series connected LEDs have the same number of LEDs. When integers "n" and "k" have different values, the string of series connected LEDs $14A_1, \ldots, 14A_n$ has a different number of LEDs than the string of series connected LEDs $14B_1, \ldots, 14B_k$. In operation, the anodes of LEDs $14A_1$ and $14B_1$ are coupled for receiving a source of operating potential $V_{DD}$. Alternatively, the anodes of LEDs $14A_1$ and $14B_1$ can be coupled to a drive, circuit that provides drive signals to LEDs $14A_1$ and $14B_1$. The cathodes of LEDs $14A_n$ and $14B_k$ are coupled for receiving a source of operating potential $V_{SS}$. By way of example, operating potential $V_{SS}$ is a ground potential. Shunt configured protection device 102 includes an input 104 connected to the anodes of LEDs $14A_1$ and $14B_1$ and an output 106 connected to the cathodes of LEDs $14A_n$ and $14B_k$. Under normal operating conditions, shunt protection device 102 functions as an open circuit such that current flows through LEDs $14A_1$-$14A_n$, and LEDs $14B_1$-$14B_k$, but does not flow through shunt protection device 102.

In accordance with an embodiment in which shunt protection circuit 102 protects against over voltages, shunt configured protection circuit 102 is referred to as an over-voltage protection (OVP) circuit. OVP circuit 102 includes an input 104 and an output 106. Input 104 is connected to the anodes of LED $14A_1$ and $14B_1$ for monitoring the voltage at the anodes of LED $14A_1$ and $14B_1$. If the voltage at the anodes of LED $14A_1$ and $14B_1$, and thus the voltage at input 104, becomes greater than a predetermined reference voltage, OVP circuit 102 closes the circuit connection between the source of operating potential $V_{DD}$ and the source of operating potential $V_{SS}$. By closing the circuit connection, OVP circuit 102 shunts diode strings 14A and 14B from source of operating potential $V_{DD}$ to substantially stop large currents from flowing through LED strings $14A_1, \ldots, A_n$ and $14B_1$ and $14B_k$. This protects LED strings $14A_1, \ldots, A_n$ and $14B_1, \ldots, 14B_k$ from damage caused by an overvoltage appearing at the anodes of LEDs $14A_1$ and $14B_1$.

Figure 23:
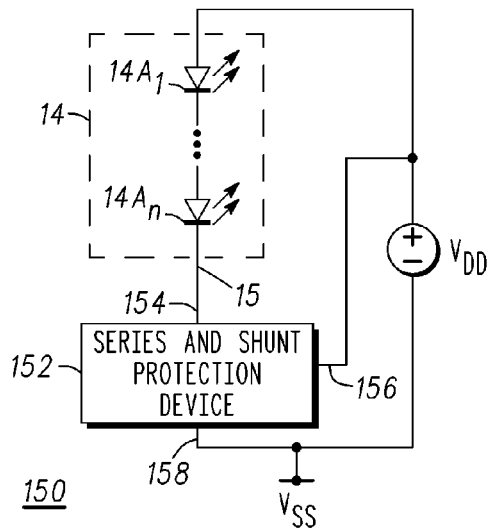
FIG. 23 is a block diagram of a circuit module that includes a protection circuit in accordance with another embodiment of the present invention.

FIG. 23 is a block diagram of a circuit module 150 that includes a protection circuit 152 coupled in a series-shunt configuration to a circuit element 14 in accordance with another embodiment of the present invention, Protection, circuit 152 is coupled between a circuit element 14 and a lower-voltage source of operating potential and therefore may be referred to as a low-side series-shunt configured protection circuit. Circuit element 14 has been described with reference to FIG. 1. The cathode 15 of LED $14_n$ is connected to an input 154 of protection circuit 152. It should be noted that in embodiments in which "n" has a value of one, circuit element 14 is comprised of a single LED $14_1$. An output 158 of protection circuit 152 is coupled for receiving a source of operating potential $V_{SS}$. Protection circuit 152 has an input 156 that is connected to the anode of LED $14_1$. In operation, the anode of LED $14_1$ and input 156 of protection circuit 12 are coupled for receiving a source of operating potential $V_{DD}$. Alternatively, the anode of LED $14_1$ and input 156 can be coupled to a drive circuit that provides a drive signal to LED $14_1$ and an input signal for protection circuit 152. Under normal operating conditions, the series portion of protection circuit 152 functions as a short circuit and the shunt portion functions as an open circuit such that cathode 15 of LED $14_n$ is connected to operating potential $V_{SS}$. By way of example, operating potential $V_{SS}$ is a ground potential. In response to a stress, the electrical path between input 154 and output 158 is opened, which disconnects input 154, and therefore cathode 15, from output 158. Opening the electrical path protects circuit element 14 from the stressor or stressful condition. Additionally, the electrical path between input 156 and output 158 is closed I response to a stress, which further helps protect circuit element 14 from the stressor or stressful condition.

As discussed above, the stressful condition may be an over-voltage condition, an over-current condition, an over-temperature condition, combinations thereof, or the like. For example, in embodiments in which the stress is an over-voltage, protection circuit 12 protects against the over-voltages and may be referred to as an over-voltage protection (OVP) circuit. If the voltage at the anode of LED $14_1$, and thus the voltage at input 156, becomes greater than a predetermined reference voltage, protection circuit 152 opens the circuit connection between the cathode of LED $14_n$ and source of operating potential $V_{SS}$, and closes the circuit connection between input 156 and the source of operating potential $V_{SS}$. By opening the circuit connection, OVP circuit 152 disconnects circuit element 14 from source of operating potential $V_{SS}$ to substantially stop large currents from flowing through LED string 14. This protects LED string 14 from damage caused by an over-voltage appearing at the anode of LED $14_1$.

Figure 24:
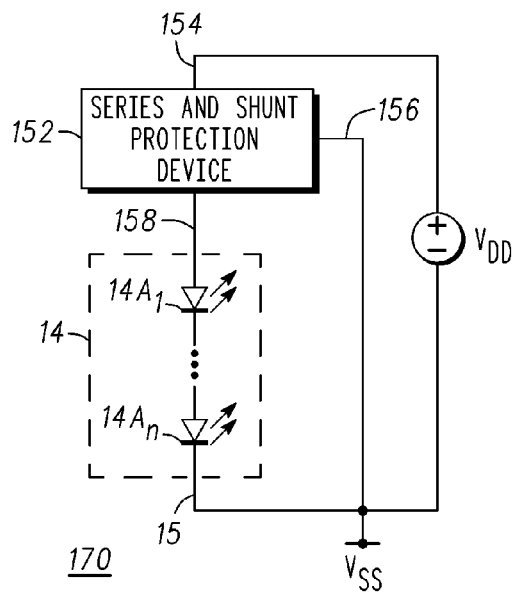
FIG. 24 is a block diagram of a circuit module that includes a protection circuit in accordance with another embodiment of the present invention.

FIG. 24 is a block diagram of a circuit module 170 that includes a protection circuit 152 coupled in a series-shunt configuration to a circuit element 14 in accordance with another embodiment of the present invention. Protection circuit 152 is coupled between a circuit element 14 and upper-voltage source of operating potential and therefore may be referred to as a high-side series-shunt configured protection circuit. Circuit element 14 has been described with reference to FIG. 1. The anode of LED $14_1$ is connected to output 158 of series-shunt configured protection circuit 152 and the cathode 15 of LED $14_n$ is coupled for receiving a source of operating potential $V_{SS}$. It should be noted that in embodiments in which "n" has a value of one, circuit element 14 is comprised of a single LED $14_1$. Input 156 of protection circuit 152 is coupled for receiving a source of operating potential $V_{SS}$. In operation, input 154 of series-shunt protection circuit 152 is coupled for receiving a source of operating potential $V_{DD}$. Alternatively, input 154 can be coupled to a drive circuit that provides a drive signal to LED $14_1$ and an input signal for protection circuit 152. Under normal operating conditions, the series portion of protection circuit 152 functions as a short circuit and the shunt portion functions as an open circuit such that the anode of LED $14_1$ is coupled to source of operating potential $V_{DD}$. By way of example, operating potential $V_{DD}$ is a 3.5 volts. In response to a stress, the electrical path between input 154 and output 158 is opened, which disconnects input 154, and therefore circuit element 152 from source of operating potential $V_{DD}$. Additionally, the electrical path between input 154 and input 156 is closed in response to a stress. Opening the electrical path protects circuit element 14 from the stressor or stressful condition.

Figure 25:
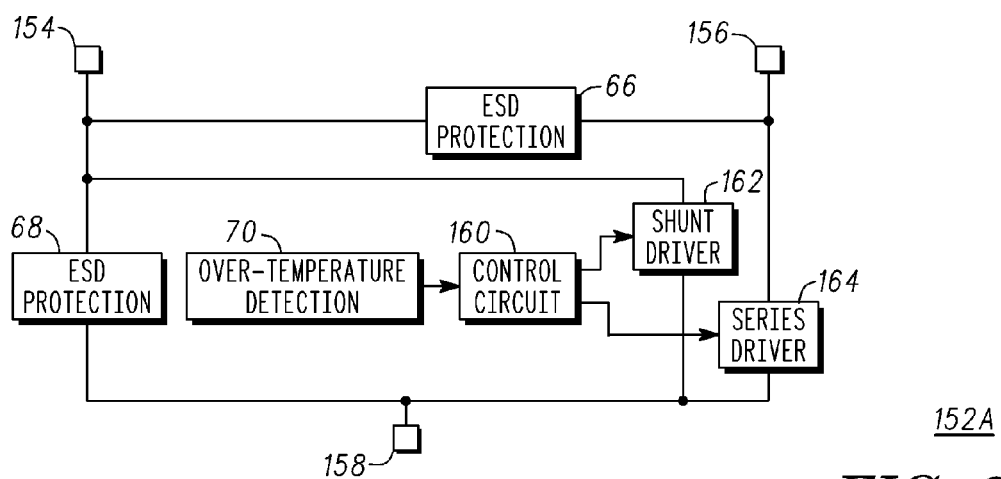
FIG. 25 is a block diagram of protection circuit in accordance with another embodiment of the present invention.

FIG. 25 is a block diagram of protection circuit 152A in accordance with another embodiment of the present invention. It should be understood that the reference character "A" has been appended to reference character "152" to distinguish protection circuit 152A from protection circuit 152 because protection circuit 152A may include different or additional features than protection circuit 152. Protection circuit 152A provides over-temperature detection circuit and may be referred to as an OTP circuit. What is shown in FIG. 25 is protection circuit 152A having inputs 154 and 156 and an output 158. An optional ESD protection circuit 66 may be coupled between inputs 156 and 154 and an optional ESD protection circuit 68 may be coupled between input 156 and output 158.

Protection circuit 152A includes an over-temperature detection stage 70 having an output connected to an input of a control circuit 160. An output of control circuit 160 is connected to a control terminal of a shunt driver circuit 162 and another output of control circuit 160 is connected to a series driver circuit 164. Shunt driver circuit 162 has an input connected to input 156 and an output connected to output 158. Series driver circuit 164 has an input connected to input 154 and an output connected to output 158. In response to the magnitude of the temperature exceeding a reference value, over-temperature detection circuit 70 generates an input signal to control circuit 160, which generates control signals for shunt driver circuit 162 and series driver circuit 164. In response to the control signal shunt driver circuit 162 closes or shorts the electrical path from input 156 to output 158 and series driver circuit opens the electrical path from input 154 to output 158. Shorting the electrical path from input 156 to output 158 shunts the stress condition away from LED $14_1$ or LEDs $14_1, \ldots, 14_n$. Opening the path from input 154 to output 158 disconnects LED $14_1$ or LEDs $14_1, \ldots, 14_n$ from output 158 which reduces the current flowing through LED $14_1$ or LEDs $14_1, \ldots, 14_n$ to substantially zero or e zero. Alternatively, protection circuit 152A reduces the current flowing through LED $14_1$ or LEDs $14_1, \ldots, 14_n$ so as to limit, the current to a safe value, where the safe value is a current level substantially equal to the nominal operating current for LED $14_1$ or LEDs $14_1, \ldots, 14_n$.

Figure 26:
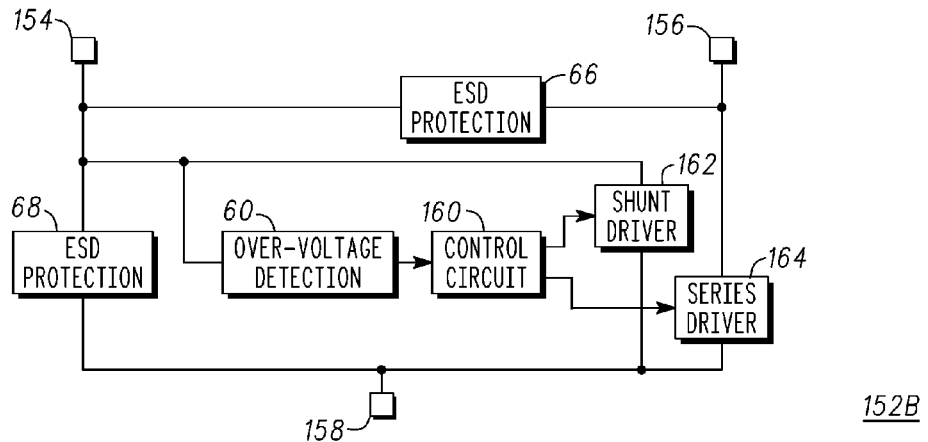
FIG. 26 is a block diagram of protection circuit in accordance with another embodiment of the present invention.

FIG. 26 is a block, diagram of protection circuit 152B in accordance with an embodiment of the present invention. It should be understood that the reference character "B" has been appended to reference character "152" to distinguish protection circuit 152B from protection circuits 152 and 152A because protection circuit 152B may include different or additional features than protection circuits 152 and 152A. Protection circuit 152B provides over-voltage detection circuit and is referred to as an OVP circuit. What is shown in FIG. 26 is protection circuit 152B having inputs 156 and 154 and output 158. Protection circuit 152B includes an over-voltage detection stage 60 having an input connected to input 156 and an output connected to an input of a control circuit 160. Over-voltage detection circuit 60 may be implemented as a resistor voltage divider network coupled between the node 156 and the node 158 and a comparator having a pair of inputs. The center tap of the resistor voltage divider network may be connected a first input of the comparator and a reference voltage may be connected to the second input of the comparator. An output of control circuit 160 is connected to a control terminal of a shunt driver circuit 162 and another output of control circuit 160 is connected to a series driver circuit 164. Shunt driver circuit 162 has an input connected to input 156 and an output connected to output 158. Series driver circuit 164 has an input connected to input 154 and an output connected to output 158. In response to the magnitude of the voltage exceeding a reference value, over-voltage detection circuit 60 generates an input signal to control circuit 160, which generates control signals for shunt driver circuit 162 and series driver circuit 164. In response to the control signal shunt driver circuit 162 closes or shorts the electrical path from input 156 to output 158 and series driver circuit opens the electrical path from input 154 to output 158. Shorting the electrical path from input 156 to output 158 shunts the stress condition away from LED $14_1$ or LEDs $14_1, \ldots, 14_n$. Opening the path from input 154 to output 158 disconnects LED $14_1$ or LEDs $14_1, \ldots, 14_n$ from output 158 which reduces the current flowing through LED $14_1$ or LEDs $14_1, \ldots, 14_n$ to substantially zero or e zero. Alternatively, protection circuit 152B reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

An optional ESD protection circuit 66 may be coupled between inputs 156 and 154 and an ESD protection circuit 68 may be coupled between input 156 and output 158. Thus, an ESD event occurring at inputs 156 or 154 activates ESD protection, circuit 66 or ESD protection circuit 68 or both.

Figure 27:
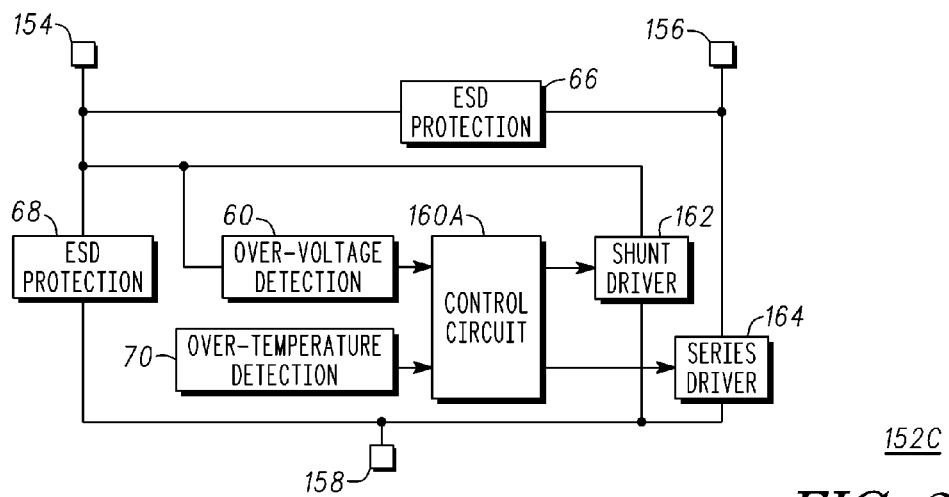
FIG. 27 is a block diagram of protection circuit in accordance with another embodiment of the present invention.

FIG. 27 is a block diagram of a protection circuit 152C in accordance with another embodiment of the present invention. It should be understood that the reference character "C" has been appended to reference character "152" to distinguish protection circuit 152C from protection circuits 152-152B because protection circuit 152C may include different or additional features than protection circuits 152-152B. in addition to over-voltage detection stage or circuit 60 shown in FIG. 26, protection circuit 152C includes an over-temperature detection circuit 70 having an output connected to another input of control circuit 160A. Like protection circuit 152B, protection circuit 152C may include an optional ESD protection circuit 66 coupled between input 156 and input 158 and an optional ESD protection circuit 68 coupled between input 104 and output 106.

Figure 28:
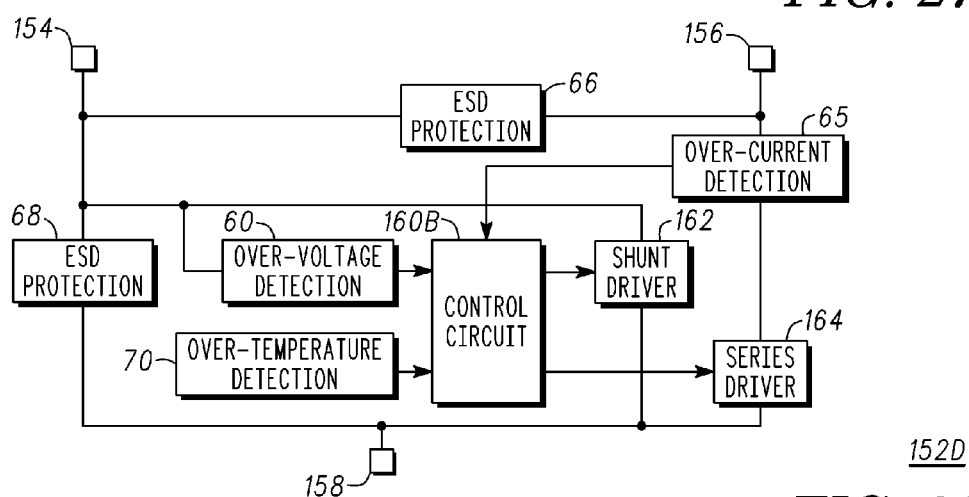
FIG. 28 is a block diagram of protection circuit in accordance with another embodiment of the present invention.

FIG. 28 is a block diagram of a protection circuit 152D in accordance with another embodiment of the present invention. It should be understood that the reference character "D" has been appended to reference character "152" to distinguish protection circuit 152D from protection circuits 152-152C because protection circuit 152D may include different or additional features than protection circuits 152-152C. What is shown in FIG. 28 is protection circuit 152D having inputs 156 and 154 and output 158. Protection circuit 152D includes over-voltage detection circuit 60, over-temperature detection circuit 70, ESD protection circuits 66 and 68, shunt drive circuit 162, and series driver circuit 164 of protection circuit 152C. In addition, protection circuit 152D includes a control circuit 160B having three inputs and an over-current detection circuit 65, An output of control circuit 160B is connected to a control terminal of a shunt driver circuit 162 and another output of control circuit 160B is connected to a control terminal of a series driver circuit 164. Shunt driver circuit 162 has an input connected to input 156 and an output connected to output 158. Series driver circuit 164 has an input connected to an over-current detection circuit 65 and an output connected to output 158. ESD protection circuit 66 is connected between inputs 156 and 154. ESD protection circuit 68 is connected between input 156 and output 158. An over-voltage detection circuit has an input connected to input 156 and an output connected to a first input of control circuit 160B. An over-temperature detection circuit has an output connected to a second input of control circuit 160B. The over-current detection circuit 65 has an input connected to input 154 and an output connected to a third input, of control circuit 160B. In response to the magnitude of the voltage exceeding a reference value, over-voltage detection circuit 60 generates an input signal to control circuit 160B, which generates control signals for shunt driver circuit 162 and series driver circuit 164. In response to the control signal shunt driver circuit 162 closes or shorts the electrical path from input 156 to output 158 and series driver circuit opens the electrical path from input 154 to output 158. Shorting the electrical path from input 156 to output 158 shunts the stress condition away from LED $14_1$ or LEDS $14_1, \ldots, 14_n$. Opening the path from input 154 to output 158 disconnects LED $14_1$ or LEDS $14_1, \ldots, 14_n$ from output 158 which reduces the current flowing through LED $14_1$ or LEDS $14_1, \ldots, 14_n$ to substantially zero or zero. Alternatively, protection circuit 152D reduces the current flowing through LED $14_1$ or LEDS $14_1, \ldots, 14_n$ so as to limit the current to a safe value, where the safe value is a current level substantially equal to the nominal operating current for LED $14_1$ or LEDS $14_1, \ldots, 14_n$. Similarly, the circuit responds in the same manner to a temperature exceeding a reference temperature value, or an electrical current from input 154 exceeding a reference current value, or any combination of simultaneous excessive voltage, temperature or current.

Figure 29:
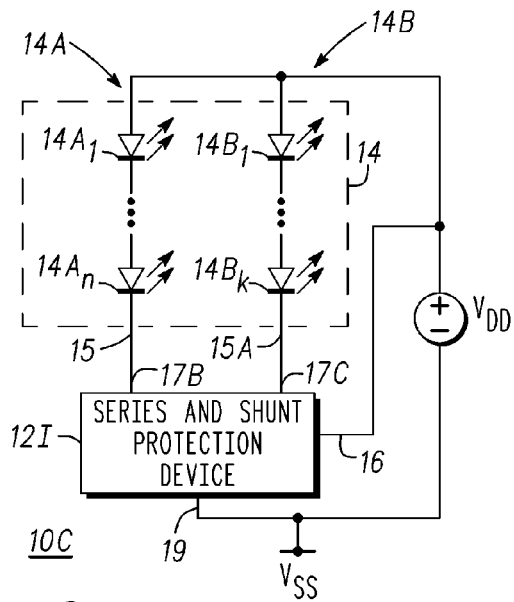
FIG. 29 is a block diagram of a circuit module that includes a protection circuit in accordance with another embodiment of the present invention.

FIG. 29 is a block diagram of a circuit module 10C that includes a Protection circuit 121 coupled to circuit element 14, which includes strings of LEDs 14A and 14B in accordance with an embodiment of the present invention. Protection circuit 121 is coupled between circuit elements 14A and 14B and a lower-voltage source of operating potential. Because of the locations of the connections of circuit elements 14A and 14B, circuit module 10C may be referred to as a low-side series-shunt configured protection circuit, By way of example, circuit element 14A is comprised of a string of series connected LEDs $14A_1, \ldots, 14A_{n}$, where "n" is an integer having a value equal to one or greater and circuit element 14B is comprised of a string of series connected LEDs $14B_1, \ldots, 14B_{k}$, where "k" is an integer having a value equal to one or greater. It should be noted that integers "n" and "k" may have the same value or they may have different values. When integers "n" and "k" have the same values, the strings of series connected LEDs have the same number of LEDs. When integers "n" and "k" have different values, the string of series connected LEDs $14A_1, \ldots, 14A_n$ has a different number of LEDs than the string of series connected LEDs $14B_1, \ldots, 14B_k$. The cathodes of LED $14A_1$ and $14B_1$ is connected to the anodes of LEDs $14A_n$ and $14B_k$, respectively, and the cathodes of LED $14B_1$ and $14B_2$ are connected to the anodes of LEDs $14A_1$ and $14B_k$. The cathode 15 of LED $14A_n$ is connected to an input 17B of protection circuit 12 and the cathode 15A of LED $14B_n$ is connected to an input 17C of protection circuit 12. It should be noted that in embodiments in which "n" has a value of one, circuit element 14A is comprised of a single LED $14A_1$ and in embodiments in which "k" has a value of one, circuit element 14B is comprised of a single LED $14B_1$. An output 19 of protection circuit 12 is coupled for receiving a source of operating potential $V_{SS}$. Protection circuit 12 has an input 16 that is connected to the anodes of LEDs $14A_1$ and $14B_1$. In operation, the anodes of LEDs $14A_1$ and $14B_1$ and input 16 of protection circuit 12 are coupled for receiving a source of operating potential $V_{DD}$. Alternatively, the anode of LEDs $14A_1$ and $14B_1$ and input 16 can be coupled to a drive circuit that provides a drive signal to LEDs $14A_1$ and $14B_1$ and an input signal for protection circuit 12. Under normal operating conditions, protection circuit 12 functions as a short circuit such that cathode 15 of LEDs $14A_n$ and $14B_k$ are connected to operating potential $V_{SS}$. By way of example, operating potential $V_{SS}$ is a ground potential. In response to a stress, the electrical path between input 17B and 17C, and output 19 is opened, which disconnects inputs 17B and 17C, and therefore cathodes 15 and 15A, from output 19. Opening the electrical path protects circuit elements 14A and 14B from the stressor or stressful condition.

The stressful condition may be an over-voltage condition, an over-current condition, an over-temperature condition, combinations thereof, or the, like. For example, in embodiments in which the stress is an over-voltage, protection circuit 12 protects against the over-voltages and may be referred to as an over-voltage protection. (OVP) circuit. If the voltage at the anodes of LEDs $14A_1$ and $14B_1$, and thus the voltage at input 16, becomes greater than a predetermined reference voltage, protection circuit 12 opens the circuit connection between the cathodes of LEDs $14A_n$ and $14B_k$ and source of operating potential $V_{SS}$. By opening the circuit connection, OVP circuit 12 disconnects circuit elements 14A and 14B from source of operating potential $V_{SS}$ to substantially stop large currents from flowing through LED strings 14A and 14B. This protects LED strings 14A and 14B from damage caused by an over-voltage appearing at the anodes of LED $14A_1$ and $14B_1$.

Figure 30:
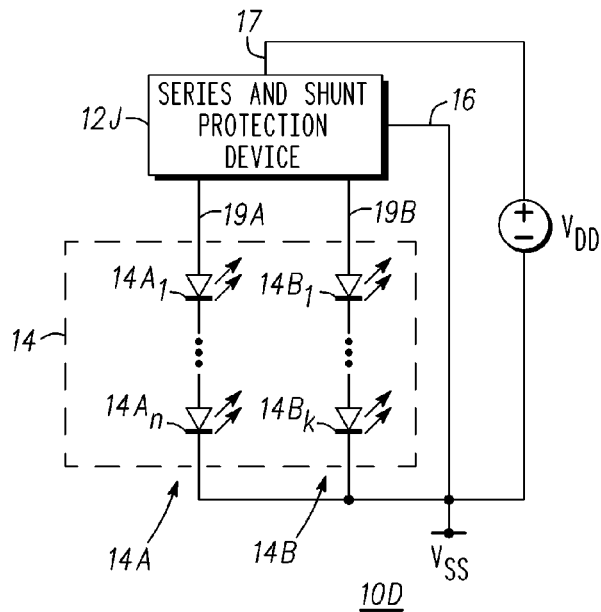
FIG. 30 is a block diagram of a circuit module that includes a protection circuit in accordance with another embodiment of the present invention.

FIG. 30 is a block diagram of a circuit module 10D that includes Protection circuit 12J connected in a high-side configuration and coupled to circuit elements 14A and 14B in accordance with another embodiment of the present invention. Protection circuit 12J is referred to as being a high-side series-shunt, configured because it is coupled between circuit elements 14A and 14B and a higher-voltage source of operating potential. As discussed above, circuit element 14A may be comprised of a string of series connected LEDs $14A_1, \ldots, 14A_n$, where "n" is an integer having a value of one or greater and circuit element 14B may be comprised of a string of series connected LEDs $14B_1, \ldots, 14B_k$, where "k" is an integer having a value of one or greater. It should be noted that integers "n" and "k" may have the same value or they may have different values. When integers "n" and "k" have the same values, the strings of series connected LEDs have the same number of LEDs. When integers "n" and "k" have different values, the string of series connected LEDs $14A_1, \ldots, 14A_n$ has a different number of LEDs than the string of series connected LEDs $14B_1, \ldots, 14B_k$. Protection circuit 12J has inputs 16 and 17 and outputs 19A and 19B. Input 16 is coupled for receiving lower-voltage source of operating potential $V_{SS}$, input 17 is coupled for receiving higher-voltage source of operating potential $V_{DD}$, and outputs 19A and 19B are connected to the anodes of LEDs $14A_1$ and $14B_1$. Alternatively, input 17 of protection circuit 12J can be coupled to a drive circuit that provides a drive signal to protection circuit 12J. Under normal operating conditions, protection circuit 12J functions as a short circuit such that source of operating potential $V_{DD}$ is connected to the anodes of LEDs $14A_1$ and $14B_1$ and input 16 is connected to source of operating potential $V_{SS}$. By way of example, operating potential $V_{SS}$ is a ground potential. In response to a stress, the electrical path between input 17 and outputs 19A and 19B are opened, which disconnects input 17 from outputs 19B and 19C. Thus circuit elements 14A and 14B are disconnected from source of operating potential $V_{DD}$. Opening the electrical path protects circuit elements 14A and 14B from the stressor or stressful condition. As discussed above, the stressful condition may be an over-voltage condition, an over-current condition, an over-temperature condition, combinations thereof, or the like.

Figure 31:
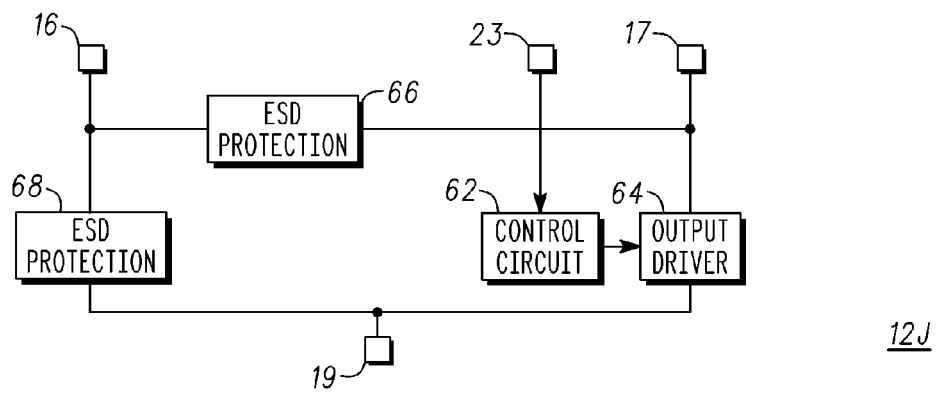
FIG. 31 is a block diagram of protection circuit in accordance with another embodiment of the present invention.

FIG. 31 is a block diagram of a protection circuit 12J in accordance with an embodiment of the present invention. It should be understood that the reference character "J" has been appended to reference character "12" to distinguish protection circuit 12J from protection circuits 12-12I because protection circuit 12J may include different or additional features than protection circuits 12-12I. Protection circuit 12J provides ESD protection and may be referred to as an ESD protection circuit. What is shown in FIG. 31 is protection circuit 12J having inputs 16, 17, and 23 and an output 19. Protection circuit 12J includes a control circuit 62 which has an input connected to input node 23 and an output connected to an input of an output driver 64. Output driver 64 has a terminal connected to input 17 and a terminal connected to output 19. Protection circuit 12J further includes an ESD protection circuit 66 coupled between inputs 16 and 17 and an ESD protection circuit 68 coupled between input 16 and input node 23. in response to and ESD event, one or both of ESD protection circuits 66 and 68 create a path to ground which directs current flow such that it bypasses circuits 62 and 64. In addition, an external signal may appear at input node 23 that causes control circuit 62 to generate a control signal that causes output driver 64 to open the path between input 17 and output 19. Opening this path disconnects LED $14_1$ or LEDS $14_1, \ldots, 14_n$ from source of operating potential $V_{SS}$ reduces the current flowing through LED $14_1$ or LEDS $14_1, \ldots, 14_n$ such that the current is zero or substantially zero. Alternatively, protection circuit 12J reduces the current flowing through LED $14_j$ or LEDs $14_1, \ldots, 14_n$ so as to limit the current to a safe value, where the safe value is a current level substantially equal to the nominal operating current for LED $14_1$ or LEDs $14_1, \ldots, 14_n$. It should be noted that protection circuit 12A may re-establish a connection from input 17 to output 19 in response to a stress being removed.

Figure 32:
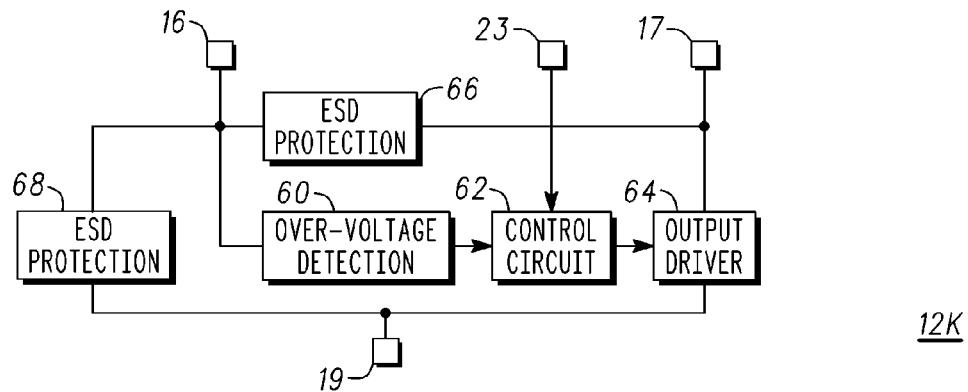
FIG. 32 is a block diagram of protection circuit in accordance with another embodiment of the present invention.

FIG. 32 is a block diagram of a protection circuit 12K in accordance with another embodiment of the present invention. It should be understood that the reference character "K" has been appended to reference character "12" to distinguish protection circuit 12K from protection circuits 12-12J because protection circuit 12K may include different or additional features than protection circuits 12-12J. What is shown in FIG. 32 is protection circuit 12K having inputs 16, 17, and 23 and an output 19. Protection circuit 12J includes a control circuit 62 which has an input connected to input node 23 and an output connected to an input of an output driver 64. Output driver 64 has a terminal connected to input 17 and a terminal connected to output 19. Optionally protection circuit 12K includes an ESD protection circuit 66 coupled between inputs 16 and 17 and an ESD protection circuit 68 coupled between input 16 and input node 23. In response to and ESD event, one or both of ESD protection circuits 66 and 68 create a path to ground which directs current flow such that it bypasses circuits 62 and 64. An over-voltage detection circuit 60 has an input connected to input 16 and an output coupled to another input of control circuit 12, In response to the magnitude of a voltage appearing at input 16 being greater than a magnitude of a reference voltage, over-voltage detection circuit 60 generates a control signal that is transmitted to control circuit 62, which in turn causes output driver 64 to open the path between input 17 and output 19, disconnecting LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. In addition, an external signal may appear at input node 23 that causes control circuit 62 to generate a control signal that causes output driver 64 to open the path between input 17 and output 19, disconnecting LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12K reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1$. Opening this path disconnects LED $14_1$ or LEDS $14_1, \ldots, 14_n$ from source of operating potential $V_{SS}$ reduces the current flowing through LED $14_1$ or LEDS $14_1, \ldots, 14_n$ such that the current is zero or substantially zero. Alternatively, protection circuit 12K reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. It should be noted that protection circuit 12K may re-establish a connection from input 17 to output 19 in response to a stress being removed.

Figure 33:
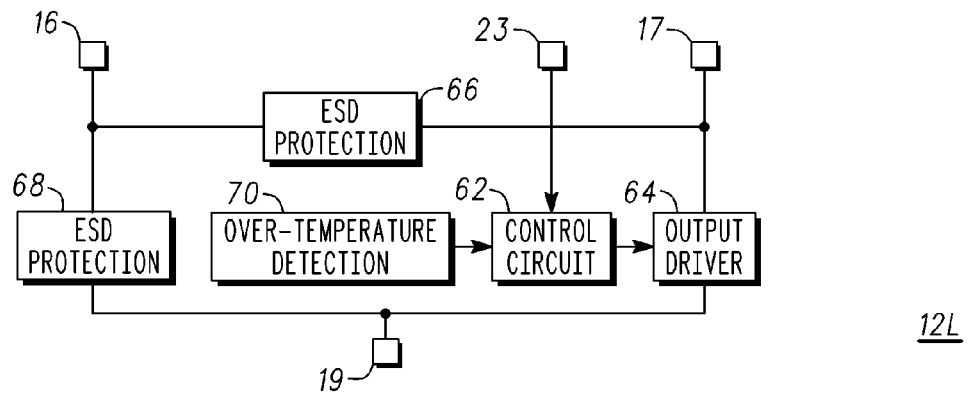
FIG. 33 is a block diagram of protection circuit in accordance with another embodiment of the present invention.

FIG. 33 is a block diagram of a protection circuit 12L in accordance with another embodiment of the present invention. It should be understood that the reference character "L" has been appended to reference character "12" to distinguish protection circuit 12L from protection circuits 12-12K because protection circuit 12L may include different or additional features than protection circuits 12-12K. What is shown in FIG. 33 is protection circuit 12L having inputs 16, 17, and 23 and an output 19. Protection circuit 12K includes a control circuit 62 which has an input connected to input node 23 and an output connected to an input of an output driver 64. Output driver 64 has a terminal connected to input 17 and a terminal connected to output 19. Optionally protection circuit 12J includes an ESD protection circuit 66 coupled between inputs 16 and 17 and an ESD protection circuit 68 coupled between input 16 and input node 23. In response to and ESD event, one or both of ESD protection circuits 66 and 68 create a path to ground which directs current flow such that it bypasses circuits 62 and 64. An over-temperature detection circuit 65 has an output coupled to another input of control circuit 12. In response to the magnitude of the temperature being greater than a magnitude of a reference temperature, over-temperature detection circuit 70 generates a control signal that is transmitted to control circuit 62, which in turn causes output driver 64 to open the path between input 17 and output 19, disconnecting LED $14_1$ or LEDs $14_1, \ldots, 14_n$ from source of operating potential $V_{SS}$ resulting in reducing the current flowing through LED $14_j$ or LEDs $14_1, \ldots, 14_n$ to be substantially zero or to be zero. In addition, an external signal may appear at input node 23 that causes control circuit 62 to generate a control signal that causes output driver 64 to open the path between input 17 and output 19, disconnecting LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12L reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. Opening this path disconnects LED $14_1$ or LEDS $14_1, \ldots, 14_n$ from source of operating potential $V_{SS}$ reduces the current flowing through LED $14_1$ or LEDS $14_1, \ldots, 14_n$ such that the current is zero or substantially zero. Alternatively, protection circuit 12L reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. It should be noted that protection circuit 12L may re-establish a connection from input 17 to output 19 in response to a stress being removed.

Figure 34:
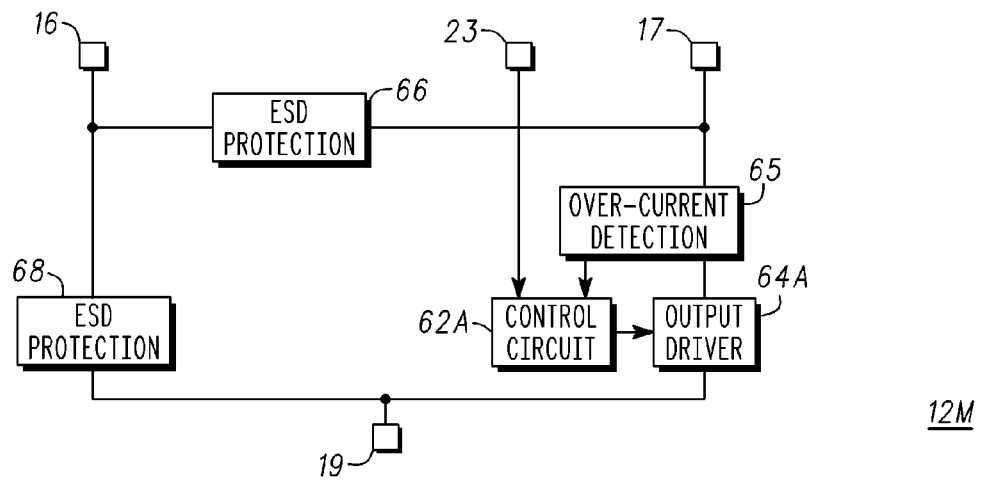
FIG. 34 is a block diagram of protection circuit in accordance with another embodiment of the present invention.

FIG. 34 is a block diagram of a protection circuit 12M in accordance with another embodiment of the present invention. It should be understood that the reference character "M" has been appended to reference character "12" to distinguish protection circuit 12M from protection circuits 12-12L, because protection circuit 12M may include different or additional features than protection circuits 12-12L. What is shown in FIG. 34 is protection circuit 12M having inputs 16, 17, and 23 and an output 19. Protection circuit 12M includes a control circuit 62A which has an input connected to input node 23 and an output connected to an input of an output driver 64A. Output driver 64A has a terminal connected to input 17 and a terminal connected to output 19. Optionally protection circuit 12M includes an ESD protection circuit 66 coupled between inputs 16 and 17 and an ESD protection circuit 68 coupled between input 16 and input node 23. In response to and ESD event, one or both of ESD protection circuits 66 and 68 create a path to ground which directs current flow such that it bypasses circuits 62A and 64A. Protection circuit 12M includes an over-current detection circuit 65 that has an output coupled to another input of control circuit 12. In response to a stress condition in which the magnitude of the current flowing through input 17 is greater than the magnitude of a reference current, over-current detection circuit 65 generates a control signal that is transmitted to the input of control circuit 62A, which generates a control signal that causes output driver 64A to open the path between input 17 and output 19. Opening this path disconnects LED $14_1$ or LEDs $14_1, \ldots, 14_n$ from source of operating potential $V_{SS}$ which reduces the current flowing through LED $14_1$ or LEDs $14_1, \ldots, 14_n$ to zero or substantially zero. Alternatively, protection circuit 12D reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$.

In addition, an external control signal may appear at input node 23 that causes control circuit 62 to generate a control signal that in turn causes output driver 64 to open the path between input 17 and output 19, disconnecting LED $14_1$ or LEDs $14_1, \ldots, 14_n$ from source of operating potential $V_{SS}$ resulting in reducing the current flowing through LED 14, or LEDs $14_1, \ldots, 14_n$ to be substantially zero or to be zero. Alternatively, protection circuit 12M reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. Opening this path disconnects LED $14_1$ or LEDS 14, . . . , $14_n$, from source of operating potential $V_{SS}$ reduces the current flowing through LED $14_{1 \, or}$ LEDS $14_1, \ldots, 14_n$ such that the current is zero or substantially zero. Alternatively, protection circuit 12L reduces the current flowing through LED 14, or LEDs $14_1, \ldots, 14_n$ so as to limit the current to a safe value, where the safe value is a current level substantially equal to the nominal operating current for LED $14_1$ or LEDs $14_1, \ldots, 14_n$. It should be noted that protection circuit 12M may re-establish a connection from input 17 to output 19 in response to a stress being removed.

Figure 35:
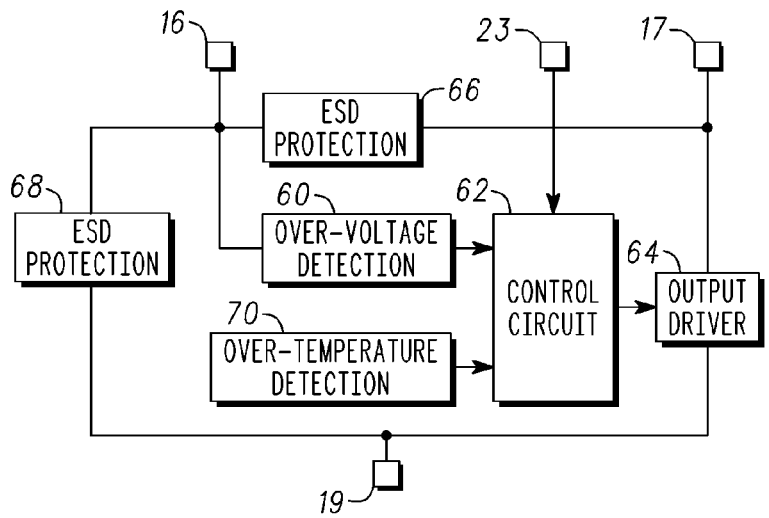
FIG. 35 is a block diagram of protection circuit in accordance with another embodiment of the present invention.

FIG. 35 is a block diagram of a protection circuit 12N in accordance with another embodiment of the present invention. It should be understood that the reference character "N" has been appended to reference character "12" to distinguish protection circuit 12N from protection circuits 12-12M, because protection circuit 12N may include different or additional features than protection circuits 12-12M. What is shown in FIG. 34 is protection circuit 12M having inputs 16, 17, and 23 and an output 19. Protection circuit 12N includes a control circuit 62 which has an input connected to input node 23 and an output connected to an input of an output driver 64. Output driver 64 has a terminal connected to input 17 and a terminal connected to output 19. Optionally protection circuit 12N includes an ESD protection circuit 66 coupled between inputs 16 and 17 and an ESD protection circuit 68 coupled between input 16 and input node 23. In response to and ESD event, one or both of ESD protection circuits 66 and 68 create a path to ground which directs current flow such that it bypasses circuits 62 and 64. Protection circuit 12N includes an and over-voltage detection circuit 60 and an over-temperature detection circuit 70, which circuits, connection and operation have been described with reference to FIG. 11.

In addition, an external control signal may appear at input node 23 that causes control circuit 62 to generate a control signal that causes output driver 64 to open the path between input 17 and output 19, disconnecting LED $14_1$ or LEDs $14_1, \ldots, 14_n$ from source of operating potential $V_{SS}$ resulting in reducing the current flowing through LED $14_1$ or LEDs $14_1, \ldots, 14_n$ to be substantially zero or to be zero. Alternatively, protection circuit 12M reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. Opening this path disconnects LED $14_1$ or LEDS $14_1, \ldots, 14_n$ from source of operating potential $V_{SS}$ reduces the current flowing through LED $14_1$ or LED $14_1, \ldots, 14_n$ such that the current is zero or substantially zero. Alternatively, protection circuit 12N reduces the current flowing through LED $14_1$ or LEDs $14_1, \ldots, 14_n$ so as to limit the current to a safe value, where the safe value is a current level substantially equal to the nominal operating current for LED $14_1$ or LEDs $14_1, \ldots, 14_n$. It should be noted that protection circuit 12N may re-establish, a connection from input 17 to output 19 in response to a stress being removed.

Figure 36:
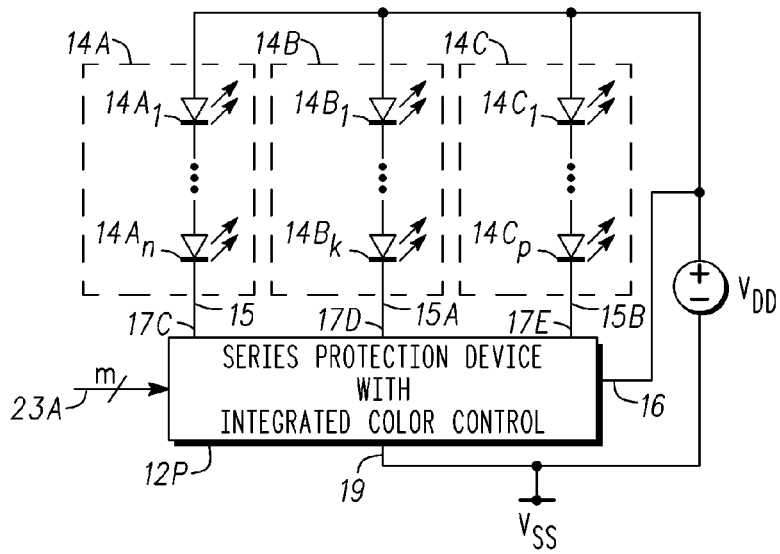
FIG. 36 is a block diagram of a circuit module that includes a protection and color control circuit in accordance with another embodiment of the present invention.

FIG. 36 is a block diagram of a circuit module 10E that includes a Protection circuit 12P with integrated color control coupled to circuit element 14, which includes strings of LEDs 14A, 14B, and 14C in accordance with an embodiment of the present invention. Although only three strings of LEDs are illustrated, it should be noted that there may be four, five, six, or more strings of LEDs. In addition, each string of LEDs may have the same number of LEDs or a different number of LEDs. Protection and color control circuit 12P is coupled between circuit elements 14A, 14B, and 14C and a lower-voltage source of operating potential. Because of the locations of the connections of circuit elements 14A, 14B, and 14C, circuit module 10E may be referred to as a low-side series configured protection circuit having an integrated color control feature. Circuit elements 14A and 14B have been described with reference to FIG. 29. Circuit element 14C may be comprised of a string of series connected LEDs $14A_1, \ldots, 14A_p$, where "p" is an integer having a value of one or greater. It should be noted that integers "n," "k," (integers "n" and "k" have been described with reference to FIG. 29) and "p" may have the same value or they may have different values. When integers "n," "k," and "p" have the same values, the strings of series connected LEDs 14A, 14B, and 14C have the same number of LEDs. When integers "n," "k," and "p" have different values, the strings of series connected LEDs 14A, 14B, and 14C have different numbers of LEDs. It should be noted that two of integers "n," "k," and "p" may have the same value and the third one a different value. Preferably each circuit element 14A, 14B, and 14C emits a different color of light. For example, string of LEDs 14A may emit red light, string of LEDs 14B may emit blue light, and string of LEDs 14C may emit green light. In accordance with alternative embodiments, circuit module 10E may include one or more strings of LEDs 14A that emit red light, one or more strings of LEDs 14B that emit blue light, and one or more strings of LEDs 14C that emit green light. In addition, the number of strings of LEDs 14A, 14B, and 14C may be different from each other. For example, there may be four strings of LEDs 14A that emit red light, three strings of LEDs 14B that emit blue light, and one string of LEDs 14C that emit green light. An output 19 of protection circuit 12P is coupled for receiving a source of operating potential $V_{SS}$. Protection circuit 12P has an input 16 that is connected to the anodes of LEDs $14A_1$, $14B_1$, and $14C_1$. In operation, the anodes of LEDs $14A_1$, $14B_1$, and $14C_1$ and input 16 of protection and color control circuit 12P are coupled for receiving a source of operating potential $V_{DD}$. Alternatively, the anodes of LEDs $14A_1$, $14B_1$, and $14C_1$ and input 16 can be coupled to a drive circuit that provides a drive signal to LEDs $14A_1$, $14B_1$, and $14C_1$ and an input signal for protection circuit 12P. Under normal operating conditions, protection and color control circuit 12P functions as a short circuit such that cathodes 15, 15A, and 15B of LEDs $14A_n$, $14B_k$, and $14C_p$ are connected to operating potential $V_{SS}$. By way of example, operating potential $V_{SS}$ is a ground potential. In response to a stress, the electrical path between input 17C, 17D, and 17E and output 19 is opened, which disconnects input inputs 17C, 17D, and 17E, and therefore cathodes 15, 15A, and 15B, from output 19. Opening the electrical path protects circuit elements 14A, 14B, and 14C from the stressor or stressful condition.

The stressful condition may be an over-voltage condition, an over-current condition, an over-temperature condition, combinations thereof, or the like.

In addition, protection and color control circuit 12P includes a control input 23A that receives a control signal representative of the desired module light color. It should be noted that the variable "m" has been shown with input 23A to indicate that input 23A may be comprised of one or more signal lines. In response to the control signal appearing at input 23A, protection and color control circuit 12P adjusts the currents flowing through diode strings 14A, 14B, and 14C to emit the desired color and intensity of the light signal. By way of example, protection and color control circuit 12P includes current switches coupled to each LED string 14A, 14B, and 14C and generates, for example, pulse width modulated control signals that modulate the current levels flowing through LED strings 14A, 14B, and 14C. By regulating the current levels, protection and color control circuit 12P adjusts the light intensity emitted from the LEDs of LED strings 14A, 14B, and 14C.

Figure 37:
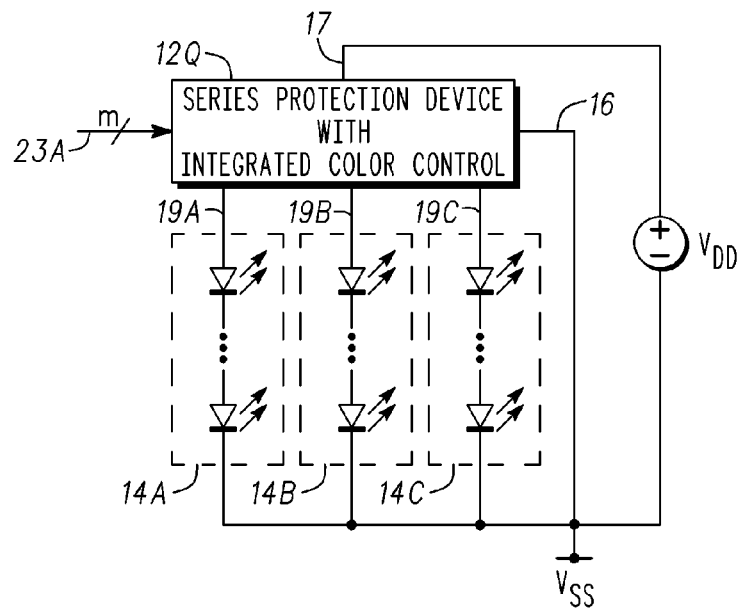
FIG. 37 is a block diagram of a circuit module that includes a protection and color control circuit in accordance with an embodiment of the present invention.

FIG. 37 is a block diagram of a circuit module 10F that includes protection and color control circuit 12Q connected in a high-side configuration and coupled to circuit elements 14A, 14B, and 14C in accordance with another embodiment of the present invention. Protection and color control circuit 12Q is referred to as being a high-side series configured control circuit because it is coupled between circuit elements 14A, 14B, and 14C and a higher-voltage source of operating potential. Circuit elements 14A, 14B, and 14C have been discussed with reference to FIG. 36, Preferably each circuit element 14A, 14B, and 14C emits a different color of light. For example, string of LEDs 14A may emit red light, string of LEDs 14B may emit blue light, and string of LEDs 14C may emit green light. In accordance with alternative embodiments, circuit module 10F may include one or more strings of LEDs 14A that emit red light, one or more strings of LEDs 14B that emit blue light, and one or more strings of LEDs 14C that emit green light. In addition, the number of strings of LEDs 14A, 14B, and 14C may be different from each other. For example, there may be one string of LEDs 14A that emit red light, three strings of LEDs 14B that emit blue light, and six strings of LEDs 14C that emit green light. Protection and color control circuit 12Q has inputs 16 and 17 and outputs 19A, 19B, and 19C. Input 16 is coupled for receiving lower-voltage source of operating potential $V_{SS}$, input 17 is coupled for receiving higher-voltage source of operating potential $V_{DD}$, and outputs 19A, 19B, and 19C are connected to the anodes of LEDs $14A_1$, $14B_1$, and $14C_1$, respectively. Alternatively, input 17 of protection circuit 12 can be coupled to a drive circuit that provides a drive signal to protection circuit 12. Under normal operating conditions, protection circuit 12 functions as a short circuit such that source of operating potential $V_{DD}$ is connected to the anodes of LEDs $14A_1$ and $14B_1$ and input 16 is connected to source of operating potential $V_{SS}$. By way of example, operating potential $V_{SS}$ is a ground potential. In response to a stress, the electrical path d between input 17 and outputs 19A, 19B, and 19C are opened, which disconnects input 17 from outputs 19A, 19B, and 19C. Thus circuit elements 14A and 14B are disconnected from source of operating potential $V_{DD}$. Opening the electrical path protects circuit elements 14A, 14B, and 14C from the stressor or stressful condition. As discussed above, the stressful condition may be an over-voltage condition, an over-current condition, an over-temperature condition, combinations thereof, or the like.

In addition, protection and color control circuit 12Q includes a control input 23A that receives a control signal representative of the desired module light color. It should be noted that the variable "m" has been shown with input 23A to indicate that input 23A may be comprised of one or more signal lines. In response to the control signal appearing at input 23A, protection and color control circuit 12Q adjusts the currents flowing through diode strings 14A, 14B, and 14C to emit the desired color and intensity of the light signal. By way of example, protection and color control circuit 12Q includes current switches coupled to each LED string 14A, 14B, and 14C and generates, for example, pulse width modulated control signals that modulate the current levels flowing through LED strings 14A, 14B, and 14C. By regulating the current levels, protection and color control circuit 12P adjusts the light intensity emitted from the LEDs of LED strings 14A, 14B, and 14C. Thus, modulation of the current in each string of LEDs 14A, 14B, and 14C achieves the overall light color emitted from circuit module 10F. Another method for modulating the current is to continuously vary the current.

Figure 38:
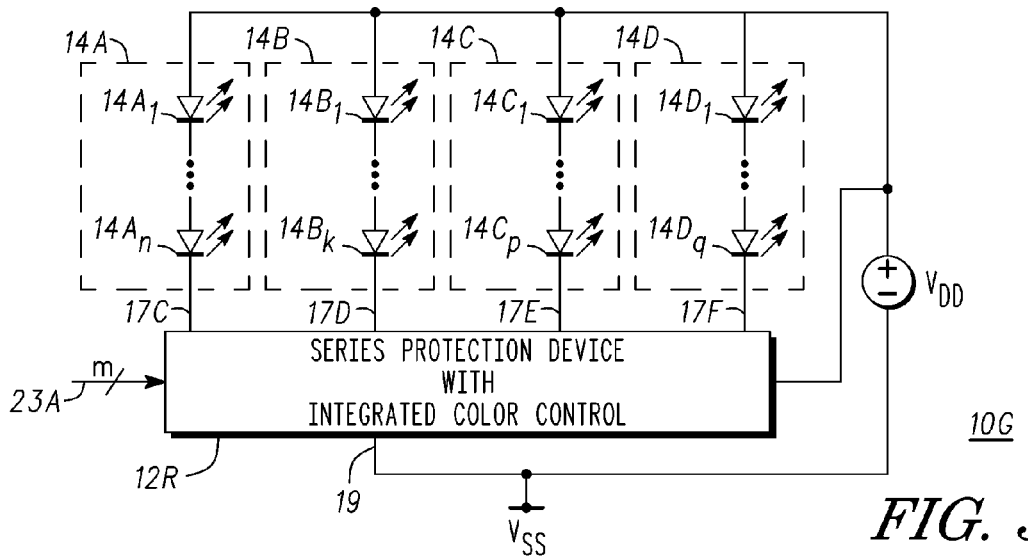
FIG. 38 is a block diagram of a circuit module that includes a protection and color control circuit in accordance with another embodiment of the present invention.

FIG. 38 is a block diagram of a circuit module 10G that includes a Protection circuit 12R with integrated color control coupled to circuit element 14, which includes strings of LEDs 14A, 14B, 14C, and 14B in accordance with another embodiment of the present invention. Although only fourth strings of LEDs are illustrated, it should be noted that there may be five, six, seven, or more strings of LEDs. In addition, each string of LEDs may have the same number of LEDs or a different number of LEDs. Protection and color control circuit 12R is coupled between circuit elements 14A, 14B, 14C, and 14D and a lower-voltage source of operating potential. Because of the locations of the connections of circuit elements 14A, 14B, 14C, and 14D, circuit module 10G may be referred to as a low-side series configured protection circuit having an integrated color control feature. Circuit elements 14A, 14B, and 14C have been described with reference to FIG. 36. Circuit element 14D may be comprised of a string of series connected LEDs $14A_1, \ldots, 14A_q$, where "q" is an integer having a value of one or greater. It should be noted that integers "n," "k," "p" (integers "n," "k," and "p" have been described with reference to FIG. 36) and "q" may have the same value or they may have different values. When integers "n," "k," "p," and "q" have the same values, the strings of series connected LEDs 14A, 14B, 14C, and 14D have the same number of LEDs. When integers "n," "k," "p," and "q" have different values, the strings of series connected LEDs 14A, 14B, 14C, and 14D have different numbers of LEDs. It should be noted that one or more of integers "n," "k," "p," and "q" may have the same value and the others a different value. Preferably each circuit element 14A, 14B, 14C, and 14D emits a different color of light. For example, string of LEDs 14A may emit red light, string of LEDs 14B may emit blue light, string of LEDs 14C may emit green light, and string of LEDs 14D may emit white light. In accordance with alternative embodiments, circuit module 10G may include one or more strings of LEDs 14A that emit red light, one or more strings of LEDs 14B that emit blue light, one or more strings of LEDs 14C that emit green light, and one or more strings of LEDs 14D that emit white light. In addition, the number of strings of LEDs 14A, 14B, 14C, and 14D may be different from each other. For example, there may be two strings of LEDs 14A that emit red light, five strings of LEDs 14B that emit blue light, one string of LEDs 14C that emit green light, and six strings of LEDs 14D that emit white light. An output 19 of protection circuit 12 is coupled for receiving a source of operating potential $V_{SS}$. Protection and color control circuit 12R has an input 16 that is connected to the anodes of LEDs $14A_1$, $14B_1$, $14C_1$, and $14D_1$. In operation, the anodes of LEDs $14A_1$, $14B_1$, $14C_1$, and $14D_1$ and input 16 of protection and color control circuit 12R are coupled for receiving a source of operating potential $V_{DD}$. Alternatively, the anodes of LEDs $14A_1$, $14B_1$, $14C_1$, and $14D_1$ and input 16 can be coupled to a drive circuit that provides a drive signal to LEDs $14A_1$, $14B_1$, $14C_1$, and $14D_1$ and an input signal for protection circuit 12P. Under normal operating conditions, protection and color control circuit 12R functions as a short circuit such that cathodes 15, 15A, 15B, and 15C of LEDs $14A_n$, $14B_k$, $14C_p$, and $14D_q$ are connected to operating potential $V_{SS}$. By way of example, operating potential $V_{SS}$ is a ground potential. In response to a stress, the electrical path between 17 inputs 17C, 17D, 17E, and 17F and output 19 is opened, which disconnects inputs 17C, 17D, 17E, and 17F, and therefore cathodes 15, 15A, 15B, and 15C, from output 19. Opening the electrical path protects circuit elements 14A, 14B, 14C, and 14D from the stressor or stressful condition.

The stressful condition may be an over-voltage condition, an over-current condition, an over-temperature condition, combinations thereof, or the like.

In addition, protection and color control circuit 12R includes a control. input 23A that receives a control signal representative of the desired module light color. It should be noted that the variable "m" has been shown with input 23A to indicate that input 23A may be comprised of one or more signal lines. In response to the control signal appearing at input 23A, protection and color control circuit 12R adjusts the currents flowing through diode strings 14A, 14B, 14C, and 14D to emit the desired color and intensity of the light signal. By way of example, protection and color control circuit 12R includes current switches coupled to each LED string 14A, 14B, 14C, and 14D and generates, for example, pulse width modulated control signals that modulate the current levels flowing through LED strings 14A, 14B, 14C, and 14D. By regulating the current levels, protection and color control circuit 12R adjusts the light intensity emitted from the LEDs of LED strings 14A, 14B, 14C, and 14D.

Figure 39:
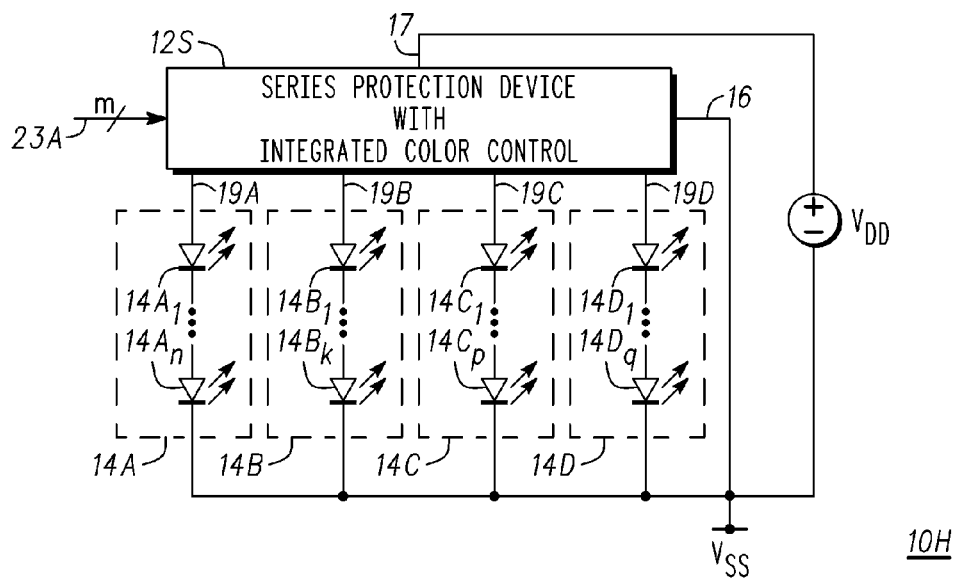
FIG. 39 is a block diagram of a circuit module that includes a protection and color control circuit in accordance with another embodiment of the present invention.

FIG. 39 is a block diagram of a circuit module 10H that includes protection and color control circuit 12S connected in a high-side configuration and coupled to circuit elements 14A, 14B, 14C, and 14D in accordance with another embodiment of the present invention. Protection circuit 12S is referred to as being a high-side series configured control circuit because it is coupled between circuit elements 14A, 14B, 14C, and 14D and a higher-voltage source of operating potential. FIG. 39 has Been included for the sake of completeness and is similar to protection and color control circuit 12Q except that it includes string of LEDs 14D connected to an output 19D.

Figure 40:
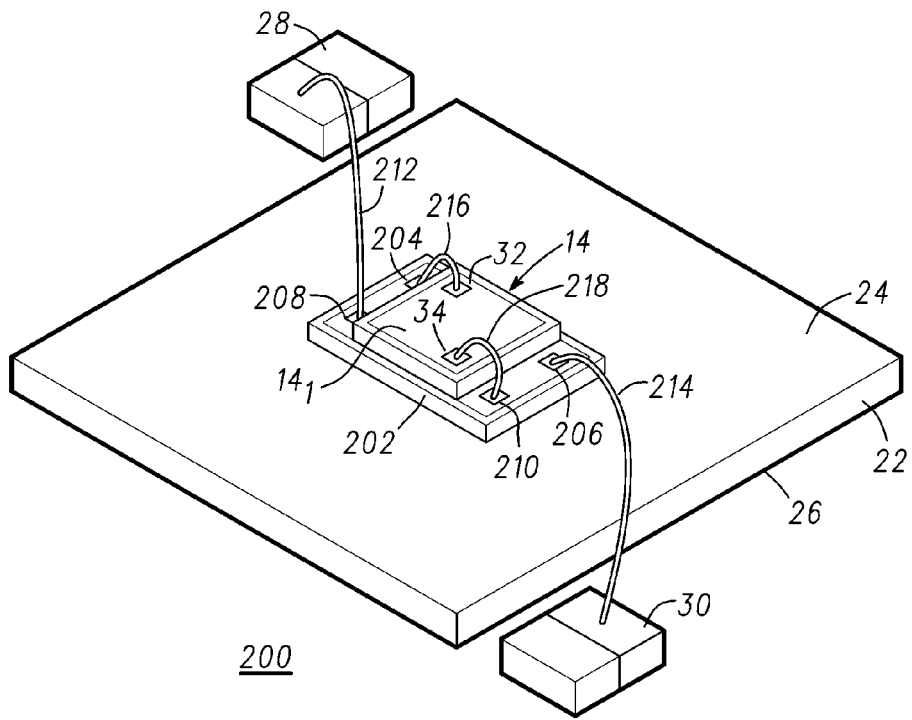
FIG. 40 is an isometric, view of a circuit module that includes a protection circuit in accordance with another embodiment of the present invention.

FIG. 40 is an isometric view of a module 200 that includes a protection circuit 202 coupled to a support 22 and an LED $14_1$ mounted on protection circuit 202. Support 22 has been described with reference to FIG. 2. Protection circuit 202 may be coupled to support 22 using a thermally conductive and electrically non-conductive die attach material, a thermally conductive and electrically conductive die attach material, or the like.

LED $14_1$ and protection circuit 202 are mounted on support 22. LED $14_1$ and protection circuit 202 may be coupled to support 22 using a thermally conductive and electrically conductive die attach material, a thermally conductive and electrically nonconductive die attach material, or the like. By way of example, protection circuit 202 has bond pads 204, 206, 208, and 210 and LED 14₁ has bond pads 32 and 34 and may be coupled to protection circuit 202 using an electrically non-conductive die attach material or the like. Bond pad 208 is coupled to lead 28 though a wire bond 212 and bond pad 206 may be coupled to lead 30 through a wire bond 214. Bond pad 204 is coupled to bond pad 32 through a wire bond 216 and bond pad 210 is coupled to bond pad 34 through a wire bond 218. By way of example, the anode of LED 14₁ is connected to bond pad 32 and the cathode of LED 14₁ is connected to bond pad 34. Lead 28 may be coupled for receiving a source of operating potential such as, for example, potential $V_{DD}$, and lead 30 may be coupled for receiving a source of operating potential such as, for example, $V_{SS}$. In accordance with embodiments of the present invention, operating potential $V_{DD}$ is substantially 3.5 volts and operating potential $V_{SS}$ is substantially 0 volts. Although not shown, support 22, LED 14₁, 14₂, 14₃, and 14₄ protection circuit 202, interposers 254, 256, and 258, wire bonds 260, 262, 264, 266, 268, 270, and 272, and leads 28 and 30 may be protected by an encapsulant capable of transmitting the light emitted by LED 14₁.

It should be noted that protection circuit 202 may include an over-voltage detection circuit, an over-current detection circuit, an over-temperature detection circuit, one or more ESD protection circuits, or the like, and combinations thereof.

Figure 41:
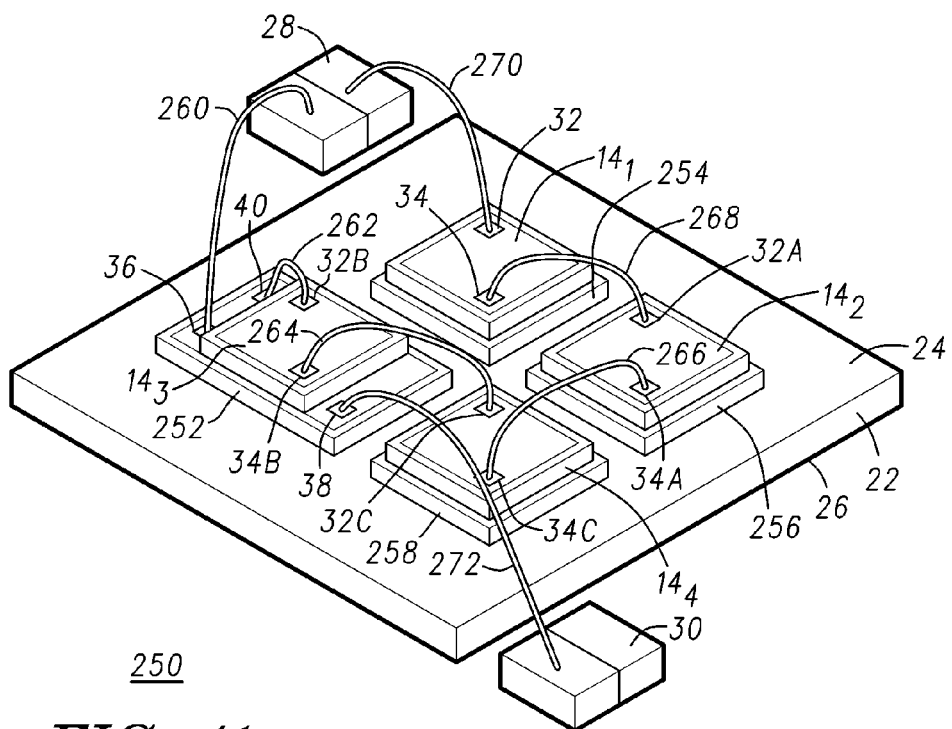
FIG. 41 is an isometric view of a circuit module that includes a protection circuit in accordance with another embodiment of the present invention.

FIG. 41 is an isometric view of a module 250 that includes a protection circuit 252 coupled to a support 22 and one or more interposers coupled to support 22. Support 22 has been described with reference to FIG. 2. By way of example, three interposers 254, 256, and 258 are shown as being coupled to support 22. Suitable materials for interposers 254-258 include ceramic material, silicon glass, silicon nitride, silicon carbide, printed circuit board material, electrically conductive material, or the like. Protection circuit 252 and interposers 254-258 may be coupled to support 22 using a thermally conductive and electrically non-conductive die attach material, a thermally conductive and electrically conductive die attach material, or the like.

LED 14₁ is coupled to interposer 254, LED 14₂ is coupled to interposer 256, LED 14₃ is coupled to protection circuit 252, and LED 14₄ is coupled to interposer 258. LED 14₁ and protection circuit 202 are mounted on support 22 using, for example, a thermally conductive die attach material. LED 14₁ has bond pads 32 and 34. LED 14₂ has bond pads 32A and 34A, LED 14₃ has bond pads 32B and 34B, and LED 14₄ has bond pads 32C and 34C. Bond pad 36 of protection circuit 252 is coupled to lead 28 through a wire bond 260, bond pad 40 is coupled to bond pad 32B through a wire bond 262, bond pad 34B is coupled to bond pad 32C through a wire bond 264, bond pad 34C is coupled to a bond pad 34A through a wire bond 266, bond pad 32A is coupled to a bond pad 34 through a wire bond 268, bond pad 32 is coupled to lead 28 through a wire bond 270, and bond pad 38 is coupled to lead 30 through a wire bond 272. By way of example, the anode of LED 14₁ is connected to bond pad 32 and the cathode of LED 14₁ is connected to bond pad 34. Lead 28 may be coupled for receiving a source of operating potential such as, for example, potential $V_{DD}$, and lead 30 may be coupled for receiving a source of operating potential such as, for example, $V_{SS}$. In accordance with embodiments of the present invention, operating potential $V_{DD}$ is substantially 14 volts and operating potential $V_{SS}$ is substantially 0 volts. Although not shown, support 22, LED 14₁, protection circuit 252, wire bonds 260, 262, 264, 266, 268, 270, and 272, and leads 28 and 30 may be protected by an encapsulant capable of transmitting the light emitted by LEDs 14₁, 14₂, 14₃, and 14₄.

It should be noted that protective circuit 252 may include an over-voltage detection circuit, an over-current detection circuit, an over-temperature detection circuit, one or more ESD protection circuits, or the like, and combinations thereof Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for protecting a first circuit element from a stress condition, comprising:
   providing a support that is a unitary structure and has a surface in a first plane;
   mounting a first device chip to the surface of the support, wherein the first device chip includes the first circuit element and wherein the first circuit element comprises a diode;
   mounting a first semiconductor chip to the surface of the support, wherein the first semiconductor chip includes first and second inputs and an output and comprises:
     an electrostatic discharge protection device having a first input coupled to the first input of the first semiconductor chip and an output coupled to the second input of the first semiconductor chip; and
     an over-temperature detection circuit having an output coupled to the output of the first semiconductor chip;
     a control circuit having first, second, and third inputs and an output, the first input of the control circuit coupled to the output of the electrostatic discharge protection device;
     an over-current detection circuit having an input and first and second outputs, the first output coupled to the second input of the control circuit; and
     an output driver having first, second, and third terminals, the first terminal of the output driver coupled to the output of the control circuit and the second terminal of the output driver coupled to the second output of the over current detection circuit;
   coupling the output of the first semiconductor chip to the first circuit element; and
   inactivating the first circuit element in response to the stress condition.

2. The method of claim 1, wherein mounting the first device chip to the surface of the support includes mounting a light emitting diode to the support.

3. The method of claim 1, wherein inactivating the first circuit element includes electrically decoupling the first circuit element from a source of operating potential.

4. The method of claim 1, wherein the first semiconductor chip further includes an over-voltage detection circuit having a first input coupled to the first input of the first semiconductor chip, and wherein inactivating the first circuit element in response to the stress condition includes inactivating the first circuit element in response to an overvoltage condition.

5. The method of claim 1, wherein inactivating the first circuit element in response to the stress condition includes inactivating the first circuit element in response to an over-current condition.

6. The method of claim 1, wherein inactivating the first circuit element in response to the stress condition includes inactivating the first circuit element in response to an over temperature condition.

7. The method of claim 1, wherein inactivating the first circuit element in response to the stress condition includes diverting electrical transients from an electrostatic discharge event away from the first circuit element.

8. The method of claim 1, wherein inactivating the first circuit element in response to the stress condition includes inactivating the first circuit element in response to an over-current condition, an over temperature condition, an overvoltage condition, or an electrostatic discharge event.

9. The method of claim 1, further including using the over-temperature detection circuit of the first semiconductor chip to detect an over-temperature condition of the circuit element of the device chip.

10. A module including circuitry for protecting against a stress condition, comprising:
   a support configured as a unitary structure and having a surface in a first plane
   a first semiconductor chip mounted to the surface of the support, the first semiconductor chip including a light emitting diode;
   a second semiconductor chip having first and second inputs and an output mounted to the surface of the support, the second semiconductor chip comprising:
      a first electrostatic discharge protection device having a first input coupled to the first input of the second semiconductor chip and an output coupled to the second input of the second semiconductor chip;
      an over-temperature detection circuit having an output coupled to the output of the second semiconductor chip; wherein the first input of the second semiconductor chip is coupled to the light emitting diode of the first semiconductor chip and wherein the second semiconductor chip is configured to inactivate the light emitting diode of the first semiconductor chip in response to the stress condition;
      a control circuit having first, second, and third inputs and an output, the first input coupled to the output of the first electrostatic discharge protection device;
      an over-current detection circuit having an input and first and second outputs, the first output coupled to the second input of the control circuit; and
      an output driver having first, second, and third terminals, the first input coupled to the output of the control circuit and the second terminal coupled to the second output of the over-current detection circuit.

11. The module of claim 10, wherein the light emitting diode of the first semiconductor chip is coupled in series with the first electrostatic discharge protection device.

12. The module of claim 11, further including a second semiconductor chip mounted on the surface of the support, wherein the second semiconductor device includes a second light emitting diode, the second light emitting diode having a cathode, wherein the cathode is directly connected to the first input of the second semiconductor chip.

13. The module of claim 11, further including a second semiconductor chip mounted on the surface of the support, wherein the second semiconductor device includes a second light emitting diode, the second light emitting diode having an anode, wherein the anode is directly connected to the second input of the second semiconductor chip.

14. The module of claim 10, wherein the second semiconductor chip includes an integrated color control portion.

15. The module of claim 10, wherein the first semiconductor chip is mounted on the second semiconductor chip.

16. The module of claim 10, further including a third semiconductor chip that includes a second light emitting diode, and a first interposer, wherein the second semiconductor chip is mounted to a first portion of the support, the first semiconductor chip is mounted on the second semiconductor chip, the first interposer is mounted to a second portion of the support, and the third semiconductor chip is mounted on the interposer.

17. The module of claim 16, wherein the first semiconductor chip is electrically coupled to the second light emitting diode and to the second semiconductor chip.

18. The module of claim 10, wherein the light emitting diode is coupled in parallel with the second semiconductor chip.

19. The module of claim 10, wherein the second semiconductor chip includes first and second sections, and wherein the light emitting diode is coupled in series with the first section and in parallel with the second section.

20. The module of claim 10, further including a third semiconductor chip, wherein the second semiconductor chip comprises a first protection device having a plurality of terminals, wherein the first semiconductor chip comprises at least one light emitting diode coupled to a first terminal of the plurality of terminals and the third semiconductor chip comprises at least one light emitting diode coupled to a second terminal of the plurality of terminals, and wherein the first light emitting diode emits light of a first color and the second light emitting diode emits light of a second color.

21. The module of claim 10, wherein the second semiconductor chip includes an integrated color control portion having first, second, and third terminals, and further including second and third light emitting diodes, the first light emitting diode coupled to the first terminal of the integrated control portion, the second light emitting diode coupled to the second terminal of the integrated control portion, and the light emitting diode coupled to the third terminal of the integrated control portion, and wherein the first light emitting diode emits light of a first color, the second light emitting diode emits light of a second color, and the third light emitting diode emits light of a third color.

22. A circuit module including circuitry configured to protect against a stress condition, comprising:
   a support having first and second major surfaces, the support being a unitary structure and the first major surface in a first plane;
   a first light emitting diode mounted to a first portion of the first major surface of the support, the first light emitting diode having first and second terminals;
   a semiconductor chip mounted to a second portion of the first major surface of the support, the semiconductor chip having first and second inputs and an output, wherein the semiconductor chip comprises:
      an over-voltage protection device having an input and an output, the input coupled to the first input of the semiconductor chip;
      an over-temperature detection circuit having an output coupled to the output of the semiconductor chip;
      a first electrostatic discharge protection structure having first and second terminals, the first terminal of the first electrostatic discharge protection structure coupled to the first input of the semiconductor chip and the second terminal coupled to the output of the semiconductor chip;
      a second electrostatic discharge protection structure having first and second terminals, the first terminal of the second electrostatic discharge protection structure coupled to the first input of the semiconductor chip and the second terminal of the electrostatic discharge protection structure coupled to the second input of the semiconductor chip;

a first interconnect coupling the first input of the semiconductor chip to the first terminal of the light emitting diode;

a second interconnect coupling the second input of the semiconductor chip to the second terminal of the light emitting diode;

a control circuit having first, second, and third inputs and an output, the first input coupled to the output of the over-voltage detection circuit;

an over-current detection circuit having an input and first and second outputs, the first output coupled to the second input of the control circuit; and an output driver having first, second, and third terminals, the first input coupled to the output of the control circuit and the second terminal coupled to the second output of the over-current detection circuit.

23. The circuit module of claim 22, wherein the first and second portions of the first major surface of the support are adjacent to each other.

24. The circuit module of claim 22, wherein the over-temperature detection circuit is configured to detect an over-current condition in the light emitting diode.

25. The circuit module of claim 1, wherein the support comprises an electrically conductive material.

26. The method of claim 1, wherein mounting the first and second semiconductor chips to the first major surface of the support includes mounting the first semiconductor chip adjacent to the second semiconductor chip, wherein the first and second semiconductor chips are physically spaced apart and thermally coupled together.

* * * * *